(12) United States Patent
Lee et al.

(10) Patent No.: US 11,190,866 B2
(45) Date of Patent: Nov. 30, 2021

(54) DISPLAY DEVICE

(71) Applicant: Samsung Display Co., Ltd., Yongin-si (KR)

(72) Inventors: Jeong Heon Lee, Hwaseong-si (KR); Jong Tae Kim, Seoul (KR); Young Sik Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/917,709

(22) Filed: Jun. 30, 2020

(65) Prior Publication Data

US 2021/0014589 A1 Jan. 14, 2021

(30) Foreign Application Priority Data

Jul. 9, 2019 (KR) .................... 10-2019-0082735

(51) Int. Cl.
*H04R 1/02* (2006.01)
*H04R 9/06* (2006.01)
*G06F 3/041* (2006.01)
*G06F 3/044* (2006.01)
*H01L 27/32* (2006.01)

(52) U.S. Cl.
CPC ............ *H04R 1/028* (2013.01); *G06F 3/044* (2013.01); *G06F 3/0412* (2013.01); *G06F 3/0416* (2013.01); *H01L 27/323* (2013.01); *H01L 27/3225* (2013.01); *H04R 2400/03* (2013.01); *H04R 2499/11* (2013.01); *H04R 2499/15* (2013.01)

(58) Field of Classification Search
CPC ...................................................... H04R 1/028
See application file for complete search history.

(56) References Cited

U.S. PATENT DOCUMENTS

| 10,250,729 | B1 | 4/2019 | Jeon et al. |
| 10,356,500 | B2 | 7/2019 | Kim |
| 2019/0050024 | A1* | 2/2019 | Ahn .................. H04R 9/06 |
| 2019/0227603 | A1* | 7/2019 | Noh .................. G06F 1/1626 |
| 2019/0265793 | A1* | 8/2019 | Costante .......... G06F 3/016 |

FOREIGN PATENT DOCUMENTS

| KR | 10-0504815 | 8/2005 |
| KR | 10-2017-0076567 | 7/2017 |
| KR | 10-1880465 | 7/2018 |
| KR | 10-2019-0012004 | 2/2019 |

\* cited by examiner

*Primary Examiner* — Simon King
(74) *Attorney, Agent, or Firm* — H.C. Park & Associates, PLC

(57) ABSTRACT

A display device includes: a display panel; a frame disposed on the display panel and having a first hole and a second hole spaced apart from the first hole; a vibration device disposed on the display panel and received in the first hole; and a battery disposed on the display panel and received in the second hole. The frame has a first long side edge, a second long side edge opposite to the first long side edge, a first short side edge disposed between the first and second long side edges, and a second short side edge opposite to the first short side edge. The vibration device is disposed adjacent to the first long side edge, and the battery is disposed adjacent to the second long side edge.

21 Claims, 18 Drawing Sheets

↑ POLARITY DIRECTION

DISPLAY DEVICE

CROSS REFERENCE TO RELATED APPLICATION

This application claims priority from and the benefit of Korean Patent Application No. 10-2019-0082735, filed on Jul. 9, 2019, which is hereby incorporated by reference for all purposes as if fully set forth herein.

BACKGROUND

Field

Exemplary implementations of the invention relate generally to a display device and, more specifically, to a display device including a battery.

Discussion of the Background

With the advancement of the information age, demands for display devices for displaying images have been increasing in various forms. For example, the display devices are being applied to various electronic devices such as smartphones, digital cameras, laptop computers, navigation devices, and smart televisions. The display device may include a display panel configured to display an image and a sound generation device configured to provide sound.

The sound generation device may generate sound using a display panel or a set frame as a diaphragm.

The above information disclosed in this Background section is only for understanding of the background of the inventive concepts, and, therefore, it may contain information that does not constitute prior art.

SUMMARY

Applicant discovered that the acoustic characteristics of a sound generation device of a display device such as a vibration generating device may deteriorate based upon the arrangement and structure of the sound generation device and adjacent components such as a battery, a set frame, or the like.

Display devices constructed according to the principles and exemplary implementations of the invention are capable of generating sound efficiently and effectively without undue interference from adjacent components. For example, the display device may include a sound generation device disposed in a spatial position relative to a battery and a middle frame such that acoustic performance of the sound generation device is maximized.

Additional features of the inventive concepts will be set forth in the description which follows, and in part will be apparent from the description, or may be learned by practice of the inventive concepts.

According to one aspect of the invention, a display device includes: a display panel; a frame disposed on the display panel and having a first hole and a second hole spaced apart from the first hole; a vibration device disposed on the display panel and received in the first hole; and a battery disposed on the display panel and received in the second hole, wherein the frame has a first long side edge, a second long side edge opposite to the first long side edge, a first short side edge disposed between the first and second long side edges, and a second short side edge opposite to the first short side edge, the vibration device is disposed adjacent to the first long side edge, and the battery is disposed adjacent to the second long side edge.

The vibration device may be disposed adjacent to the first short side edge, and the battery may be disposed adjacent to the second short side edge.

The frame may include a bracket including the first and second long side edges and the first and second short side edges, and a first linear distance between the vibration device and the battery in a plan view may be greater than a second linear distance between the vibration device and the first long side edge and a third linear distance between the battery and the second long side edge.

The display device may further include a panel lower sheet disposed on the display panel, the panel lower sheet having a first surface facing the display panel and a second surface opposite to the first surface, wherein the vibration device and the battery are each attached to the second surface of the panel lower sheet.

A fourth linear distance between the vibration device and the second long side edge may range from about 1.2 times to about 9 times the second linear distance between the vibration device and the first long side edge.

The battery may include first and second side edges substantially parallel to the first and the second short side edges of the frame, the first side edge being closer to the vibration device than the second side edge, and a fifth linear distance between the vibration device and the first short side edge may range from about 0.8 times to about 1.2 times a sixth distance from the vibration to an extension line of the first side edge of the battery.

The vibration device may include third and fourth side edges substantially parallel to the first and the second short side edges of the bracket, the third side edge being closer to the battery than the fourth side edge, and a first area of a region formed by the first side edge of the battery and the third side edge of the vibration device may have a size in a range between a second area defined by the vibration device and a third area defined by the battery.

The battery may have a generally quadrangular shape, and a fifth linear distance from a center of the vibration device to a center of the battery may be greater than or equal to about 1.5 times a sixth linear distance from the center of the battery and an edge thereof.

The battery may include first and second side edges substantially parallel to the first and the second short side edges of the bracket, and the sixth linear distance may be a distance from the center of the battery to the first edge or second side edge of the battery.

The vibration device may include a sound generation device selected from the group consisting of a piezoelectric element or a piezoelectric actuator.

According to another aspect of the invention, a display device may include: a display panel; a panel lower sheet disposed on the display panel and having a first surface facing the display panel and a second surface opposite to the first surface; a frame disposed on the second surface of the panel lower sheet and having a first hole and a second hole spaced apart from the first hole; a vibration device disposed on the display panel and received in the first hole; and a battery disposed on the display panel and received in the second hole, wherein the vibration device and the battery are each attached to the second surface of the panel lower sheet; the frame has a first long side edge, a second long side edge opposite to the first long side edge, a first short side edge disposed between the first and second long side edges, and a second short side edge opposite to the first short edge, and a first linear distance between the vibration device and the battery is greater than each of (i) a second linear distance between the vibration device and (ii) the first long side edge and a third linear distance between the battery and the second long side edge.

The frame may include a bracket including the first and second long side edges and the first and second short side edges, and a fourth linear distance between the vibration device and the second long side edge may be greater than or equal to about 1.2 times the second linear distance between the vibration device and the first long side edge.

The battery may include first and second side edges substantially parallel to the first and the second short side edges of the bracket, the first side edge being closer to the vibration device than the second side edge, and a fifth linear distance between the vibration device and the first short side edge may range from about 0.8 times to about 1.2 times a sixth linear distance from the vibration device to an extension line of the first side edge of the battery.

The vibration device may include third and fourth side edges substantially parallel to the first and the second short side edges of the bracket, the third side edge being closer to the battery than the fourth side edge, and a first area of a region formed by the first side edge of the battery and the third side edge of the vibration device may have a size in a range between a second area defined by the vibration device and a third area defined by the battery.

According to still another aspect of the invention, a display device may include: a display panel; a frame disposed on the display panel and having a first hole and a second hole spaced apart from the first hole; a vibration device disposed on the display panel and received in the first hole view; and a battery disposed on the display panel and received in the second hole, wherein the frame has a first long side edge, a second long side edge opposite to the first long side edge, a first short side edge disposed between the first and second long side edges, and a second short side edge opposite to the first short side edge, the battery includes first and second side edges substantially parallel to each other, the first side edge being closer to the vibration device than the second side edge of the battery, and a first linear distance between the vibration device and the first short side edge ranges from about 0.8 times to about 1.2 times a second linear distance from the vibration device to an extension line of the first side edge of the battery.

The vibration device may be disposed adjacent to the first short side edge, and the battery may be disposed adjacent to the second short side edge.

The display device may further include a panel lower sheet disposed on the display panel, the panel lower sheet having a first surface facing the display panel and a second surface opposite to the first surface, wherein the vibration device and the battery are each attached to the second surface of the panel lower sheet.

The vibration device may include third and fourth side edges substantially parallel to the first and the second side edges of the battery, the third side edge being closer to the battery, and a first area of a region formed by the first side edge of the battery and the third side edge of the vibration device may have a size in a range between a second area defined by the vibration device and a third area defined by the battery.

The vibration device may partially overlap the battery in a longitudinally extending direction of the first long side edge.

The vibration device may completely overlap the battery in a longitudinally extending direction of the first long side edge.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
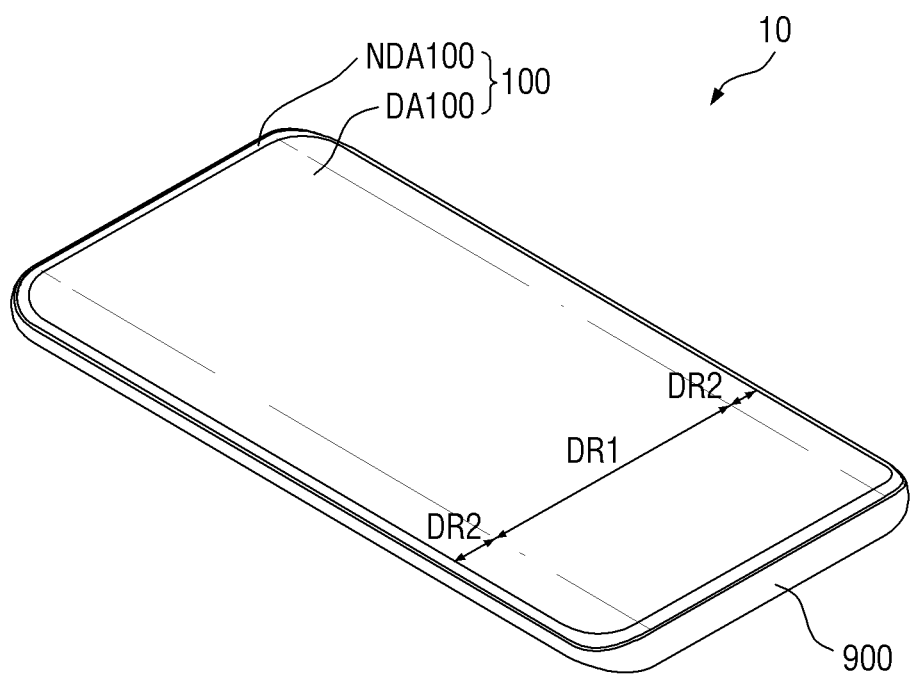
FIG. 1 is a perspective view of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
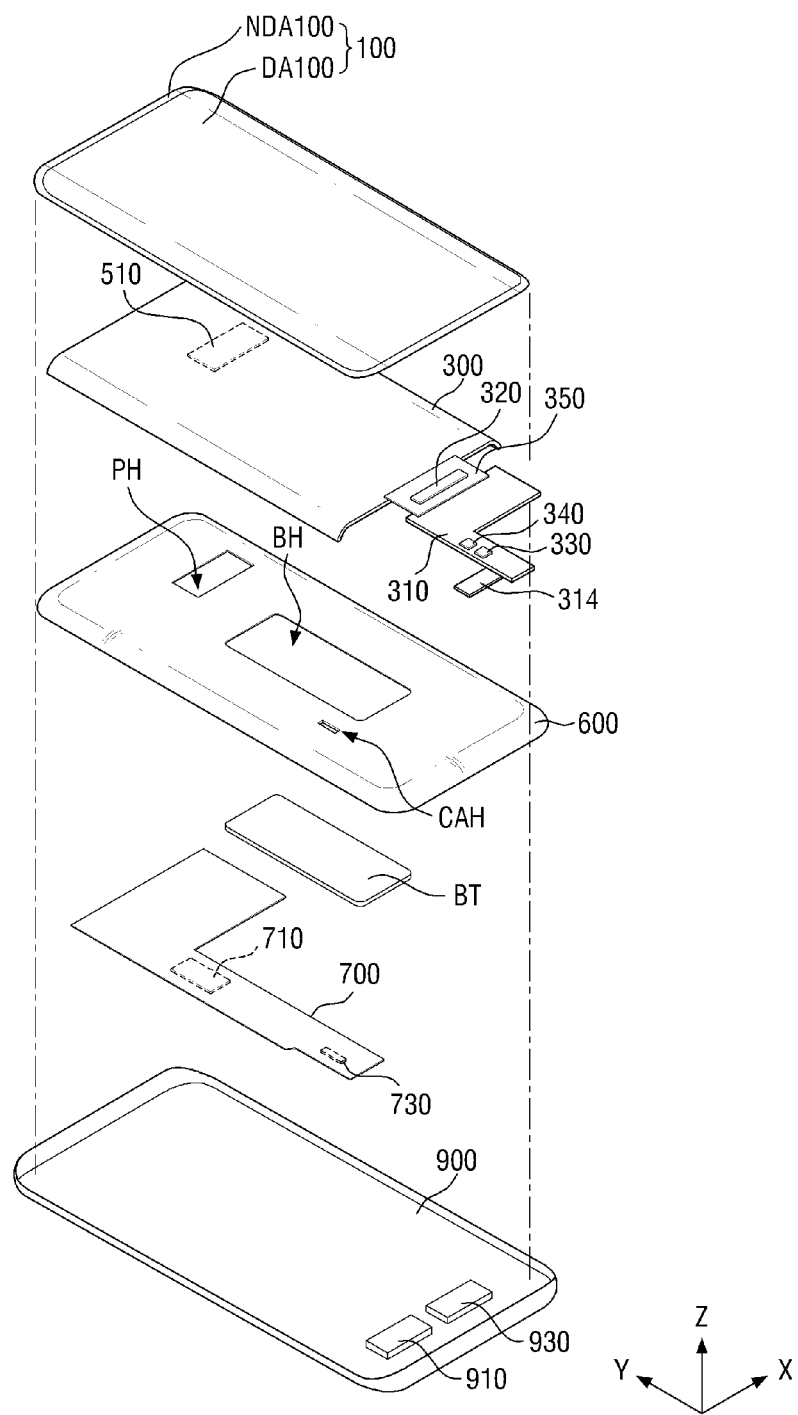
FIG. 2 is an exploded perspective view of an exemplary embodiment of a display device constructed according to the principles of the invention.

FIG. 1 is a perspective view of a display device constructed according to the principles of the invention. FIG. 2 is an exploded perspective view of an exemplary embodiment of a display device constructed according to the principles of the invention.

Referring to FIGS. 1 and 2, a display device 10 may include a cover window 100, a display panel 300, a display circuit board 310, a display driving circuit 320, a flexible film 350, a vibration device to generate sound such as sound generation device 510, a bracket 600, a main circuit board 700, and a lower cover 900.

In the specification, the term "upper" refers to a direction in which the cover window 100 is disposed with respect to the display panel 300, that is, a Z-axis direction, and the term "lower" refers to a direction in which the bracket 600 is disposed with respect to the display panel 300, that is, a direction opposite to the Z-axis direction. In addition, the terms "left," "right," "upper," and "lower" also may refer to a direction when the display panel 300 is viewed from above. For example, the term "right" refers to an X-axis direction, the term "left" refers to a direction opposite to the X-axis direction, the term "upper" refers to the Y-axis direction, and the term "lower" refers to the direction opposite to the Y-axis direction.

The display device 10 may be formed in a generally rectangular shape in a plan view. For example, as shown in FIGS. 1 and 2, a top view of the display device 10 may show a generally rectangular shape which has a short side in a first direction (X-axis direction) and a long side in a second direction (Y-axis direction). A corner at which the short side in the first direction (X-axis direction) meets the long side in the second direction (Y-axis direction) may be rounded with a certain curvature or may be formed at a right angle. The shape of the top view of the display device 10 is not limited to the rectangular shape but may be formed in another polygonal, circular, or elliptical shape.

The display device 10 may include a first region DR1 formed to be flat and second regions DR2 extending from left and right sides of the first region DR1. The second region DR2 may be formed to be flat or have a curved shape. When the second region DR2 is formed to be flat, an angle formed by the first region DR1 and the second region DR2 may be an obtuse angle. When the second region DR2 is formed to have the curved surface, the second region DR2 may have a constant curvature or a variable curvature.

The second regions DR2 are illustrated in FIG. 1 as extending from the left and right sides of the first region DR1, but exemplary embodiments are not limited thereto. That is, the second region DR2 may extend only from one side of the left and right sides of the first region DR1. Alternatively, the second region DR2 may extend from at least one of the left and right sides as well as upper and lower sides of the first region DR1. Hereinafter, the second regions DR2 are mainly described as being disposed at left and right edges of the display device 10.

The cover window 100 may be disposed on the display panel 300 to cover an upper surface of the display panel 300.

Therefore, the cover window 100 may serve to protect the upper surface of the display panel 300.

The cover window 100 may include a light transmitting portion DA100 corresponding to the display panel 300 and a light blocking portion NDA100 corresponding to a region excluding the display panel 300. The cover window 100 may be disposed in the first region DR1 and the second regions DR2. The light transmitting portion DA100 may be disposed in a portion of the first region DR1 and a portion of each of the second regions DR2. The light blocking portion NDA100 may be formed to be opaque. Alternatively, the light blocking portion NDA100 may be formed as a decorative layer having a pattern which is visible to a user when an image is not displayed.

The display panel 300 may be disposed below the cover window 100. The display panel 300 may be disposed to overlap the light transmitting portion DA100 of the cover window 100. The display panel 300 may be disposed in the first region DR1 and the second regions DR2. Therefore, an image of the display panel 300 may be displayed not only in the first region DR1 but also in the second regions DR2.

The display panel 300 may be a light-emitting display panel including a light-emitting element. For example, the display panel 300 may be an organic light-emitting display panel using an organic light-emitting diode which includes an organic light-emitting layer, a micro light-emitting diode (LED) display panel using a micro LED, a quantum dot light-emitting display panel using a quantum dot LED which includes a quantum dot light-emitting layer, or an inorganic light-emitting display panel using an inorganic light-emitting diode which includes an inorganic semiconductor. Hereinafter, the display panel 300 is mainly described as an organic light-emitting display panel.

The display circuit board 310 and the display driving circuit 320 may be attached to one side of the display panel 300. One end of the display circuit board 310 may be attached on pads provided on the one side of the display panel 300 using an anisotropic conductive film. The display circuit board 310 may be a flexible printed circuit board which is bendable, a rigid printed circuit board which is rigid and inflexible, or a composite printed circuit board including a rigid printed circuit board and a flexible printed circuit board.

The display driving circuit 320 receives control signals and power voltages through the display circuit board 310 and generates and outputs signals and voltages for driving the display panel 300. The display driving circuit 320 may be formed as an integrated circuit (IC) and may be attached on the display panel 300 through a chip-on-glass (COG) method, a chip-on-plastic (COP) method, or an ultrasonic bonding method, but exemplary embodiments are not limited thereto. For example, the display driving circuit 320 may be attached on the display circuit board 310.

A touch driving circuit 330 may be disposed on the display circuit board 310. The touch driving circuit 330 may be formed as an IC and may be attached to an upper surface of the display circuit board 310. The touch driving circuit 330 may be electrically connected to touch electrodes of a touch sensor layer of the display panel 300 through the display circuit board 310. The touch driving circuit 330 may apply touch driving signals to driving electrodes of the touch electrodes, may sense charge change amounts of capacitances between the driving electrodes and sensing electrodes through the sensing electrodes of the touch electrodes, and may output touch data including touch coordinates of a user.

A sound driving circuit 340 may be disposed on the display circuit board 310. The sound driving circuit 340 receives sound data from a main processor 710. The sound driving circuit 340 generates sound driving voltages according to the sound data and outputs the sound driving voltages to the sound generation device 510. The sound driving voltages may include a first sound driving voltage and a second sound driving voltage. The sound generation device 510 may contract or expand according to the first sound driving voltage and the second sound driving voltage and may vibrate the display panel 300 to output sound.

A power supply circuit configured to supply display driving voltages for driving the display driving circuit 320 may be disposed on the display circuit board 310. As a result, display driving voltages for driving the display panel 300 and sound driving voltages for driving the sound generation device 510 may be generated and supplied by different circuits. Therefore, it is possible to prevent the display driving voltages for driving the display panel 300 from being affected by the sound driving voltages for driving the sound generation device 510.

One side of the flexible film 350 may be attached to the upper surface of the display panel 300 at one side of the display panel 300 using an anisotropic conductive film. The other side of the flexible film 350 may be attached to the upper surface of the display circuit board 310 at one side of the display circuit board 310 using an anisotropic conductive film. The flexible film 350 may be a flexible film which is bendable.

On the other hand, the flexible film 350 may be omitted, and the display circuit board 310 may be attached directly to one side of the display panel 300. In this case, the one side of the display panel 300 may be disposed to be bent to a lower surface of the display panel 300.

The sound generation device 510 may be disposed on one surface of the display circuit board 310. The sound generation device 510 may be a piezoelectric element or a piezoelectric actuator which vibrates the display panel 300 using a piezoelectric material that contracts or expands according to an applied voltage.

A middle frame such as the bracket 600 may be disposed below the display panel 300. The bracket 600 may include plastic, metal, or both plastic and metal. The bracket 600 may have a camera hole into which a camera device is inserted and a cable hole CAH through which a cable 314 connected to the display circuit board 310 passes. In addition, the bracket 600 may have a first hole PH (or a groove) formed in a region which corresponds to and/or overlaps the sound generation device 510. The bracket 600 may have a second hole BH (or a groove) formed in a region which corresponds to and/or overlaps the battery BT. The first hole PH corresponding to the sound generation device 510 may be different from the second hole BH corresponding to the battery BT. The first hole PH and the second hole BH may be spaced apart from each other.

The main circuit board 700 may be disposed below the bracket 600. The main circuit board 700 may be a printed circuit board or a flexible printed circuit board.

The main circuit board 700 may include the main processor 710 and a main connector 730. The main processor 710 may be disposed on an upper surface of the main circuit board 700.

The main processor 710 may control all functions of the display device 10. For example, the main processor 710 may output digital video data to the display driving circuit 320 through the display circuit board 310 such that the display panel 300 displays an image. In addition, the main processor 710 may receive touch data from the touch driving circuit 330, may determine touch coordinates of a user, and then may execute an application indicated by an icon displayed on the touch coordinates of the user.

The main processor 710 may output sound data to the sound driving circuit 340 such that the sound generation device 510 vibrates the display panel 300 to output sound. The main processor 710 may generate the sound data using sound driving voltage data. The main processor 710 may be an application processor, a central processing unit, or a system chip which formed as an IC.

The cable 314 passing through the cable hole CAH of the bracket 600 may be connected to the main connector 730. Thus, the main circuit board 700 may be electrically connected to the display circuit board 310.

In addition, the main circuit board 700 may be further equipped with a mobile communication module capable of transmitting and receiving a wireless signal to and from at least one of a base station, an external terminal, and a server on a mobile communication network. The wireless signal may include various types of data associated with transmission and reception of a voice signal, a video call signal, or a text/multimedia message.

A lower cover 900 may be disposed below the bracket 600 and the main circuit board 700. The lower cover 900 may be coupled and fixed to the bracket 600. The lower cover 900 may form a lower exterior of the display device 10. The lower cover 900 may include plastic, metal, or both plastic and metal.

An earphone port device 910 and a speaker 930 capable of receiving or transmitting sound data such as a voice may be further disposed on the lower cover 900. A microphone may further be provided to sense and/or recognize the sound data. The earphone port device 910 and the speaker 930 may be disposed in forms attached to the lower cover 900, but exemplary embodiments are not limited thereto.

In addition, it is possible to output sound using the display panel 300 as a vibration surface through the sound generation device 510 which is not exposed to the outside. Thus, a speaker such as a call receiver for outputting a voice of the other party may be omitted from a front surface of the display device 10, thereby widening the light transmitting portion DA100 of the cover window 100. Therefore, it is possible to widen the region in which an image is displayed by the display panel 300.

Figure 3:
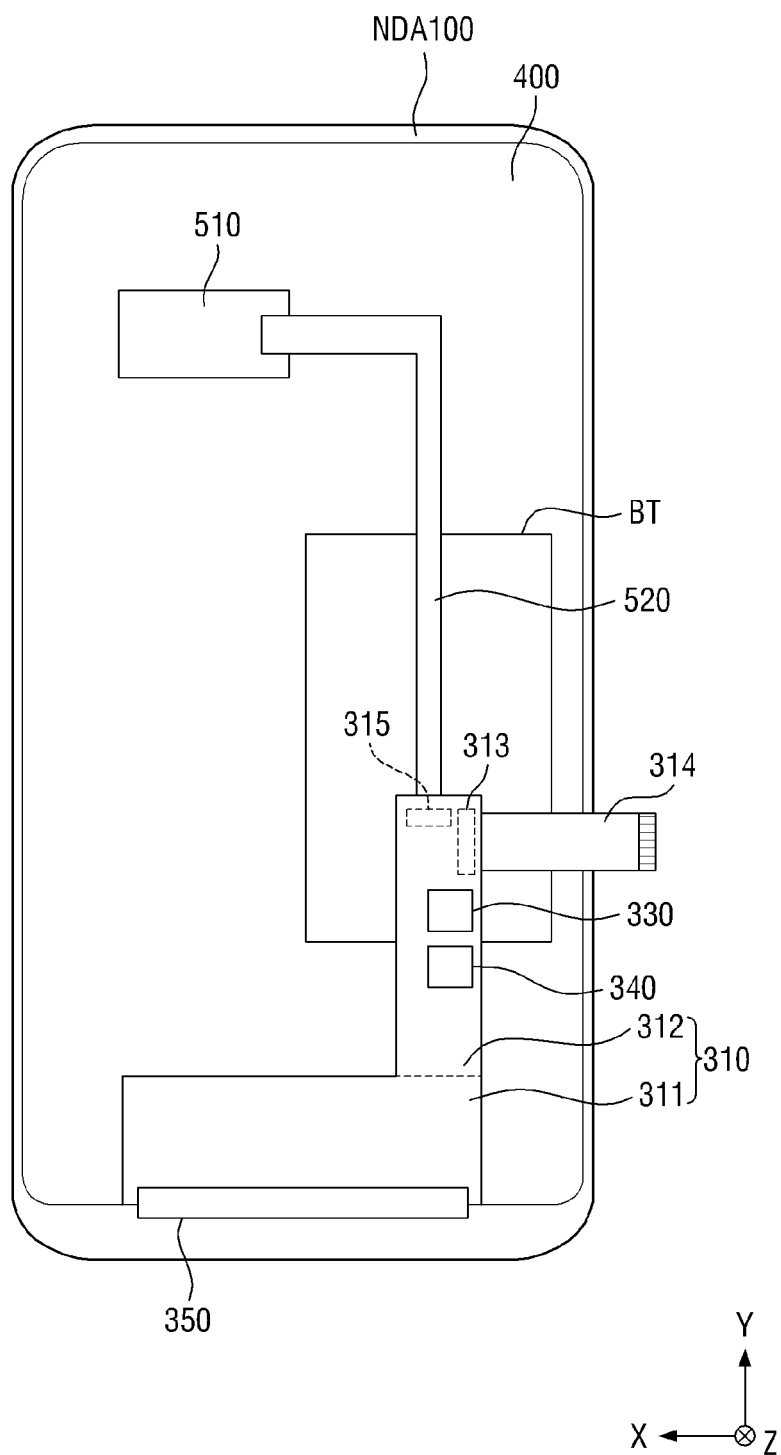
FIG. 3 is a bottom view of an exemplary embodiment of a display panel attached to a cover window of the display device of FIG. 2.
Figure 4:
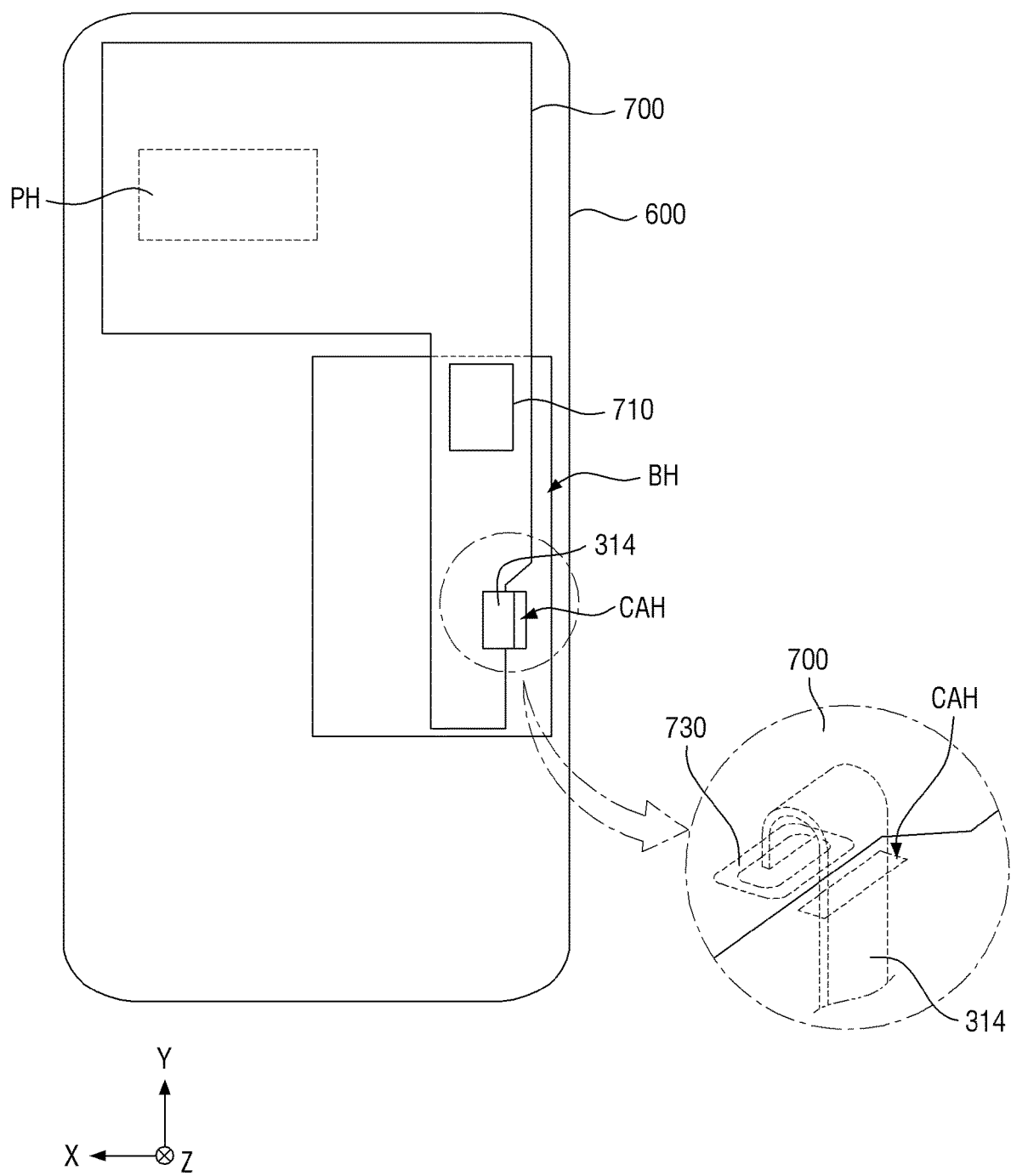
FIG. 4 is a bottom view of an exemplary embodiment of a bracket and a main circuit board of the display device of FIG. 3.

FIG. 3 is a bottom view of an exemplary embodiment of a display panel attached to a cover window of the display device of FIG. 2. FIG. 4 is a bottom view of an exemplary embodiment of a bracket and a main circuit board of the display device of FIG. 3.

Referring to FIGS. 2 to 4, a panel lower cover 400 (also referred to as a panel lower member or a panel lower sheet) may be disposed below the display panel 300. The display panel 300 may be disposed between the panel lower cover 400 and the cover window 100. The panel lower cover 400 may be attached to the lower surface of the display panel 300 through an adhesive member. The adhesive member may be a pressure sensitive adhesive (PSA).

The panel lower cover 400 may include at least one of a light absorption member configured to absorb light incident from the outside, a buffer member configured to absorb an impact from the outside, and a heat dissipation member configured to efficiently dissipate heat from the display panel 300.

The light absorption member may be disposed below the display panel 300. The light absorption member prevents transmission of light to prevent components disposed below the light absorption member, i.e., the display circuit board 310, the sound generation device 510, and the like from being viewed on the upper portion of the display panel 300. The light absorption member may include a light absorption material such as a black pigment or a dye.

The buffer member may be disposed below the light absorption member. The buffer member absorbs an external impact to prevent the display panel 300 from being damaged. The buffer member may include a single layer or a plurality of layers. For example, the buffer member may be made of a polymer resin such as polyurethane, polycarbonate, polypropylene, or polyethylene or may be made of a material having elasticity, such as a sponge formed by foam-molding rubber, a urethane-based material, or an acrylic-based material. The buffer member may be a cushioning layer.

The heat dissipation member may be disposed below the buffer member. The heat dissipation member may include a first heat dissipation layer including graphite or carbon nanotubes and a second heat dissipation layer formed as a thin film of a metal such as copper, nickel, ferrite, or silver, which is capable of shielding an electromagnetic wave and has high heat conduction quality.

The panel lower cover 400 may be omitted. In this case, components disposed on a lower surface of the panel lower cover 400, for example, the display circuit board 310 and the sound generation device 510, may be disposed on a lower surface of the display panel 300 instead of the lower surface of the panel lower cover 400.

The flexible film 350 attached to one side of the display panel 300 may be bent and disposed below the panel lower cover 400 as shown in FIG. 3. Therefore, the display circuit board 310 attached to one side of the flexible film 350 may be disposed below the panel lower cover 400. The display circuit board 310 is fixed or attached to the lower surface of the panel lower cover 400 using a fixing member such as a screw or an adhesive member such as a pressure sensitive adhesive below the panel lower cover 400.

The display circuit board 310 may include a first circuit board 311 and a second circuit board 312. For example, the first circuit board 311 and the second circuit board 312 may be a rigid printed circuit board or a flexible printed circuit board. When any one of the first circuit board 311 and the second circuit board is the rigid printed circuit board and the other thereof is the flexible printed circuit board, the display circuit board 310 may be a composite printed circuit board.

The second circuit board 312 is illustrated in FIG. 3 as extending from one side of the first circuit board 311 in the second direction (Y-axis direction). The width of the second circuit board 312 in the first direction (X-axis direction) may be smaller than the width of the first circuit board 311 in the first direction (X-axis direction).

The touch driving circuit 330 and the sound driving circuit 340 may be disposed on one surface of the second circuit board 312, and a first connector 313 and a second connector 315 may be disposed on the other surface thereof. The first connector 313 may include an insertion portion connected to a first connection terminal provided at one end of the cable 314. The second connector 315 may include an insertion portion connected to a connection terminal provided at one end of a sound circuit board 520.

The first connection terminal provided at one end of the cable 314 may be inserted into the insertion portion of the first connector 313. As shown in FIG. 4, a second connection terminal provided at the other end of the cable 314 may be bent to the main circuit board 700 through the cable hole CAH passing through the bracket 600 and may be inserted into an insertion portion of the main connector 730.

The sound generation device 510 may be disposed on the lower surface of the panel lower member 400. The sound generation device 510 may be disposed in the first hole PH of the bracket 600 in a plan view. The sound generation device 510 may be attached to the lower surface of the panel lower member 400 using an adhesive member such as a pressure sensitive adhesive. Since the display circuit board 310 is attached to the panel lower member 400, the display panel 300 may be vibrated in a thickness direction thereof (Z-axis direction) by the sound generation device 510.

The connection terminal provided at one end of the sound circuit board 520 may be inserted into the insertion portion of the second connector 315. The other end of the sound circuit board 520 may be connected to a first electrode and a second electrode of the sound generation device 510.

The battery BT may be disposed on the lower surface of the panel lower member 400. The battery BT may be disposed in the second hole BH of the bracket 600 in a plan view. The battery BT may be attached to the lower surface of the panel lower member 400 using an adhesive member such as a pressure sensitive adhesive. The battery BT may be disposed to overlap the sound circuit board 520 and the second circuit board 312 in a plan view, but exemplary embodiments are not limited thereto.

According to the illustrated embodiment shown in FIGS. 3 and 4, the main circuit board 700 and the display circuit board 310 may be electrically connected through the cable 314, and the sound generation device 510 and the display circuit board 310 may be electrically connected through the sound circuit board 520.

Figure 5:
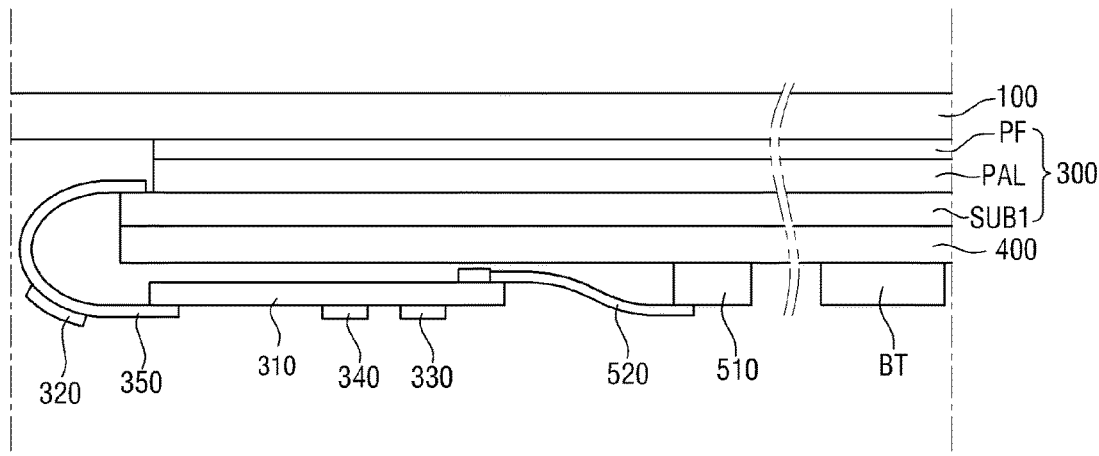
FIG. 5 is a partial, cross-sectional view of FIG. 3.

FIG. 5 is a partial, cross-sectional view of FIG. 3.

Referring to FIG. 5, the display panel 300 may include a substrate SUB1, a pixel array layer PAL, and a polarizing film PF.

The substrate SUB1 may be a rigid substrate or a flexible substrate which is bendable, foldable, and rollable. The substrate SUB1 may be made of an insulating material such as glass, quartz, or a polymer resin. Examples of a polymer material may be one selected from polyethersulphone (PES), polyacrylate (PA), polyarylate (PAR), polyetherimide (PEI), polyethylene naphthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The substrate SUB1 may also include a metal material.

Figure 6:
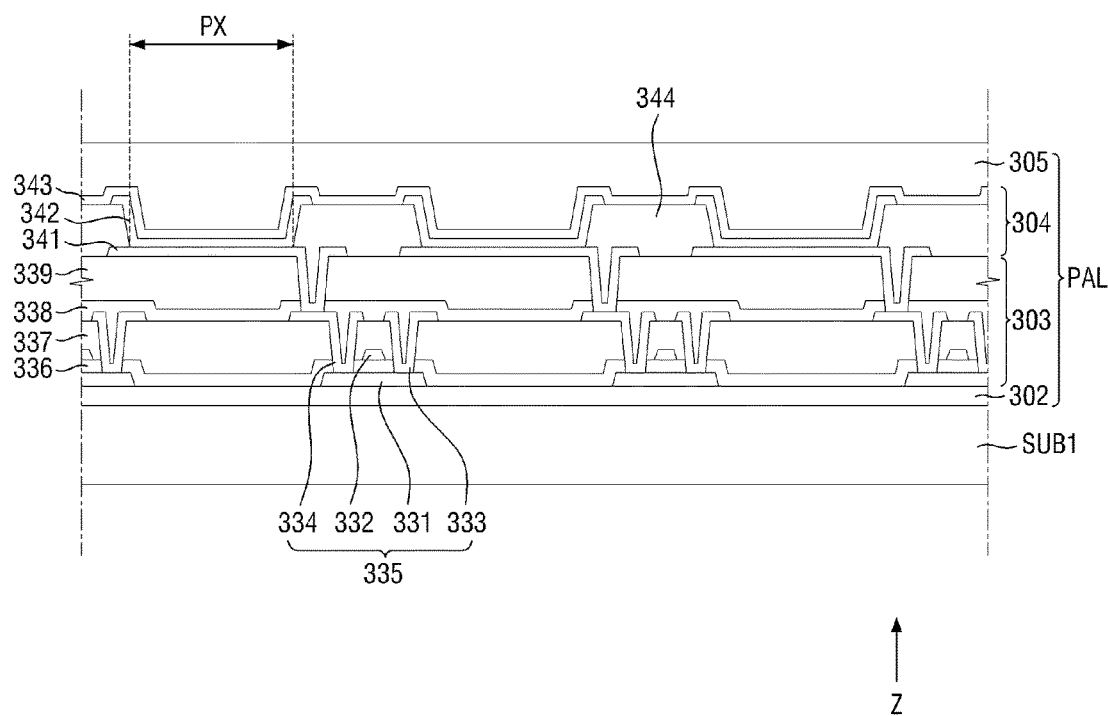
FIG. 6 is a cross-sectional view of an exemplary embodiment of the substrate and the pixel array layer of the display panel of FIG. 5.

The pixel array layer PAL may be disposed on the substrate SUB1. The pixel array layer PAL may be a layer including pixels PX to display an image. As shown in FIG. 6, the pixel array layer PAL may include a thin film transistor layer 303, a light-emitting element layer 304, and a thin film encapsulation layer 305.

The polarizing film PF may be disposed on the pixel array layer PAL so as to prevent a reduction in visibility due to external light reflection. The polarizing film PF may include a linear polarizer and a phase retardation film such as a quarter-wave plate. For example, the phase retardation film may be disposed on the pixel array layer PAL, and the linear polarizer may be disposed between the phase retardation film and the cover window 100.

The panel lower cover 400 may be disposed on one surface of the display panel 300, and the cover window 100 may be disposed on the other surface opposite to the one surface. That is, the panel lower cover 400 may be disposed on a lower surface of the substrate SUB1 of the display panel 300, and the cover window 100 may be disposed on an upper surface of the polarizing film PF.

One side of the flexible film 350 may be attached to one side of the substrate SUB1, and the other side thereof may be attached to one side of the display circuit board 310. The one side of the flexible film 350 may be attached to the one side of the substrate SUB1 using an anisotropic conductive film. The other side of the flexible film 350 may be attached to one surface of the display circuit board 310 using an anisotropic conductive film. The other surface opposite to the one surface of the display circuit board 310 may face the panel lower member 400.

The display driving circuit 320 is illustrated in FIG. 5 as being disposed on one surface of the flexible film 350, but exemplary embodiments are not limited thereto. The display driving circuit 320 may be disposed on the other surface opposite to the one surface of the flexible film 350. The other surface of the flexible film 350 may be a surface attached to one surface of the substrate SUB1 and the one surface of the display circuit board 310.

The display circuit board 310 may be disposed on the lower surface of the panel lower cover 400. The display circuit board 310 may be fixed or attached to the lower surface of the panel lower cover 400 using a fixing member such as a screw or an adhesive member such as a pressure sensitive adhesive.

The touch driving circuit 330 and the sound driving circuit 340 may be disposed on the one surface of the display circuit board 310. The first connector 313 and the second connector 315 of FIG. 3 may be disposed on the other surface of the display circuit board 310.

One surface of the sound generation device 510 may be disposed on one surface of the panel lower member 400, and the sound circuit board 520 may be attached on the other surface of the sound generation device 510. An upper surface of the sound generation device 510 may be attached to the lower surface of the panel lower member 400 using an adhesive member such as a pressure sensitive adhesive. When the sound generation device 510 is disposed on the heat dissipation member of the panel lower member 400, the first heat dissipation layer of the heat dissipation member may be broken by vibration of the sound generation device 510. Therefore, the heat dissipation member may be removed from a region in which the sound generation device 510 is disposed, and the sound generation device 510 may be attached to a lower surface of the buffer member. Alternatively, the buffer member and heat dissipation member may be removed from the region in which the sound generation device 510 is disposed, and the sound generation device 510 may be attached to a lower surface of the light absorption member.

The sound circuit board 520 may be attached to a lower surface of the sound generation device 510 using an anisotropic conductive film. Lead lines of the sound circuit board 520 may be electrically connected to the first electrode and the second electrode of the sound generation device 510. The connection terminal provided at one end of the sound circuit board 520 may be connected to the lead lines. The connection terminal of the sound circuit board 520 may be inserted into the insertion portion of the second connector 315. The sound circuit board 520 may be a flexible printed circuit (FPC) board or a flexible film.

According to the exemplary embodiment shown in FIG. 5, the sound generation device 510 may be fixed to the display panel 300 through an adhesive member and may be connected to the second connector 315 of the display circuit board 310 through the sound circuit board 520. Therefore, the sound generation device 510 may be electrically connected to the sound driving circuit 340 of the circuit board 310.

The battery BT may be fixed to the display panel 300 through an adhesive member. That is, the battery BT may be coplanar with the sound generation device 510. As described above, the battery BT and the sound generation device 510 may be attached to the panel lower member 400. The battery BT may overlap the display circuit board 310 and the sound circuit board 520 in a plan view as shown in FIG. 3, but may not overlap the display circuit board 310 and the sound circuit board 520 as shown in FIG. 4.

FIG. 6 is a cross-sectional view of an exemplary embodiment of the substrate and the pixel array layer of the display device of FIG. 5.

Referring to FIG. 6, the display panel 300 may include the substrate SUB1, and the pixel array layer PAL. As shown in FIG. 6, the pixel array layer PAL may include the thin film transistor layer 303, the light-emitting element layer 304, and the thin film encapsulation layer 305.

A buffer film 302 may be formed on the substrate SUB1. The buffer film 302 may be formed on the substrate SUB1 to protect the thin film transistors 335 and light-emitting elements from moisture permeating through the substrate SUB1 which is vulnerable to moisture permeation. The buffer film 302 may include a plurality of alternately stacked inorganic films. For example, the buffer film 302 may be formed as a multi-film in which one or more inorganic films of a silicon oxide film ($SiO_x$), a silicon nitride film ($SiN_x$), and SiON are alternately stacked. The buffer film may be omitted.

The thin film transistor layer 303 is formed on the buffer film 302. The thin film transistor layer 303 includes the thin film transistors 335, a gate insulating film 336, an interlayer insulating film 337, a protective film 338, and a planarizing film 339.

Each of the thin film transistors 335 includes an active layer 331, a gate electrode 332, a source electrode 333, and a drain electrode 334. The thin film transistor 335 is illustrated in FIG. 6 as being formed as a top gate type in which the gate electrode 332 is disposed on the active layer 331, but exemplary embodiments are not limited thereto. That is, the thin film transistor 335 may be formed as a bottom gate type in which the gate electrode 332 is disposed below the active layer 331 or a double gate type in which the gate electrode 332 is disposed on both of upper and lower portions of the active layer 331.

The active layer 331 is formed on the buffer film 302. The active layer 331 may be made of a silicon-based semiconductor material or an oxide-based semiconductor material. A light blocking layer configured to block external light incident on the active layer 331 may be formed between the buffer film 302 and the active layer 331.

The gate insulating film 336 may be formed on the active layer 331. The gate insulating film 316 may be formed as an inorganic film such as a silicon oxide ($SiO_x$) film, a silicon nitride ($SiN_x$) film, or a multi-film thereof.

The gate electrode 332 and a gate line may be formed on the gate insulating film 336. The gate electrode 332 and the gate line may be formed as a single layer or a multi-layer made of one selected from molybdenum (Mo), aluminum (Al), chromium (Cr), gold (Au), titanium (Ti), nickel (Ni), neodymium (Nd), copper (Cu), and an alloy thereof.

The interlayer insulating film 337 may be formed on the gate electrode 332 and the gate line. The interlayer insulating film 337 may be formed as an inorganic film such as a silicon oxide ($SiO_x$) film, a silicon nitride ($SiN_x$) film, or a multi-film thereof.

The source electrode 333, the drain electrode 334, and a data line may be formed on the interlayer insulating film 337. The source electrode 333 and the drain electrode 334 may be connected to the active layer 331 through contact holes passing through the gate insulating film 336 and the interlayer insulating film 337. The source electrode 333, the drain electrode 334, and the data line may be formed as a single layer or a multi-layer made of one selected from molybdenum (Mo), aluminum (Al), chromium (Cr), gold (Au), titanium (Ti), nickel (Ni), neodymium (Nd), copper (Cu), and an alloy thereof.

The protective film 338 may be formed on the source electrode 333, the drain electrode 334, and the data line to insulate the thin film transistor 335. The protective film 338 may be formed as an inorganic film such as a silicon oxide ($SiO_x$) film, a silicon nitride ($SiN_x$) film, or a multi-film thereof.

The planarizing film 339 may be formed on the protective film 338 to planarize a stepped portion due to the thin film transistor 335. The planarizing film 339 may be formed as an organic film made of an acrylic resin, an epoxy resin, a phenolic resin, a polyamide resin, a polyimide resin, or the like.

The light-emitting element layer 304 is formed on the thin film transistor layer 303. The light-emitting element layer 304 includes light-emitting elements and a pixel definition film 344.

The light-emitting elements and the pixel definition film 344 are formed on the planarizing film 339. The light-emitting element is described as an organic light-emitting device including an anode electrode 341, the light-emitting layers 342, and a cathode electrode 343.

The anode electrode 341 may be formed on the planarizing film 339. The anode electrode 341 may be connected to the drain electrode 334 of the thin film transistor 335 through a contact hole passing through the protective film 338 and the planarizing film 339.

In order to divide pixels, the pixel definition film 344 may be formed to cover an edge of the anode electrode 341 on the planarizing film 339. That is, the pixel definition film 344 serves as a pixel definition film configured to define the pixels. Each of the pixels is a region in which the anode electrode 341, the light-emitting layer 342, and the cathode electrode 343 are sequentially stacked and holes from the anode electrode 341 and electrons from the cathode electrode 343 combine in the light-emitting layer 342 to emit light.

The light-emitting layers 342 are formed on the anode electrode 341 and the pixel definition film 344. The light-emitting layer 342 may be an organic light-emitting layer. The light-emitting layer 342 may emit one of red light, green light, and blue light. Alternatively, the light-emitting layer 342 may be a white light-emitting layer which emits white light. In this case, the light-emitting layer 342 may have a shape in which a red light-emitting layer, a green light-emitting layer, and a blue light-emitting layer are stacked and may be a common layer commonly formed in the pixels. In this case, the display panel 300 may further include a separate color filter configured to display red, green, and blue.

The light-emitting layer 342 may include a hole transporting layer, an light-emitting layer, and an electron transporting layer. In addition, the light-emitting layer 342 may be formed to have a tandem structure of two or more stacks. In this case, a charge generation layer may be formed between the stacks.

The cathode electrode 343 is formed on the light-emitting layer 342. The cathode electrode 343 may be formed to cover the light-emitting layer 342. The cathode electrode 343 may be a common layer commonly formed in the pixels.

When the light-emitting element layer 304 is formed as a top emission type in which light is emitted upward, the anode electrode 341 may be made of a metal material having high reflectivity, and for example, may include a stacked structure (Ti/Al/Ti) of aluminum and titanium, a stacked structure (ITO/Al/ITO) of aluminum and ITO, a silver-palladium-copper (APC) alloy, and a stacked structure (ITO/APC/ITO) of an APC alloy and ITO. The APC alloy is an alloy of silver (Ag), palladium (Pd), and copper (Cu). In addition, the cathode electrode 343 may be made of a transparent conductive material (TCO) capable of transmitting light, such as ITO or IZO or may be made of a semi-transmissive conductive material such as magnesium (Mg), silver (Ag), or an alloy of magnesium (Mg) and silver (Ag). When the cathode electrode 343 is made of the semi-transmissive conductive material, luminous efficiency may be improved due to a microcavity.

When the light-emitting element layer 304 is formed as a bottom emission type in which light is emitted downward, the anode electrode 341 may be made of a transparent conductive material (TCO), such as ITO or IZO, or may be made of a semi-transmissive conductive material such as magnesium (Mg), silver (Ag), or an alloy of magnesium (Mg) and silver (Ag). The cathode electrode 343 may be made of a metal material having high reflectivity, and for example, may have a stacked structure (Ti/Al/Ti) of aluminum and titanium, a stacked structure (ITO/Al/ITO) of aluminum and ITO, a silver-palladium-copper (APC) alloy, and a stacked structure (ITO/APC/ITO) of an APC alloy and ITO. When the anode electrode 341 is made of the semi-transmissive conductive material, luminous efficiency may be improved due to a microcavity.

The thin film encapsulation layer 305 is formed on the light-emitting element layer 304. The thin film sealing layer 305 serves to prevent oxygen or moisture from permeating into the light-emitting layer 342 and the cathode electrode 343. To this end, the thin film encapsulation layer 305 may include at least one inorganic film. The inorganic film may be made of silicon nitride, aluminum nitride, zirconium nitride, titanium nitride, hafnium nitride, tantalum nitride, silicon oxide, aluminum oxide, or titanium oxide. In addition, the thin film encapsulation layer 305 may further include at least one organic film. The organic layer may be formed to have a sufficient thickness so as to prevent particles from passing through the thin film encapsulation layer 305 and penetrating into the light-emitting layer 342 and the cathode electrode 343. The organic film may include any one selected from an epoxy, acrylate, and urethane acrylate.

The touch sensor layer may be formed on the thin film encapsulation layer 305. When the touch sensor layer is formed directly on the thin film encapsulation layer 305, a thickness of the display device 10 may be further reduced as compared to when a separate touch panel is attached on the thin film encapsulation layer 305.

The touch sensor layer may include touch electrodes for sensing a touch of a user using a capacitance method and touch lines for connecting the touch electrodes and pads. For example, the touch sensor layer may sense the touch of the user using a self-capacitance method or a mutual capacitance method.

Figure 7:
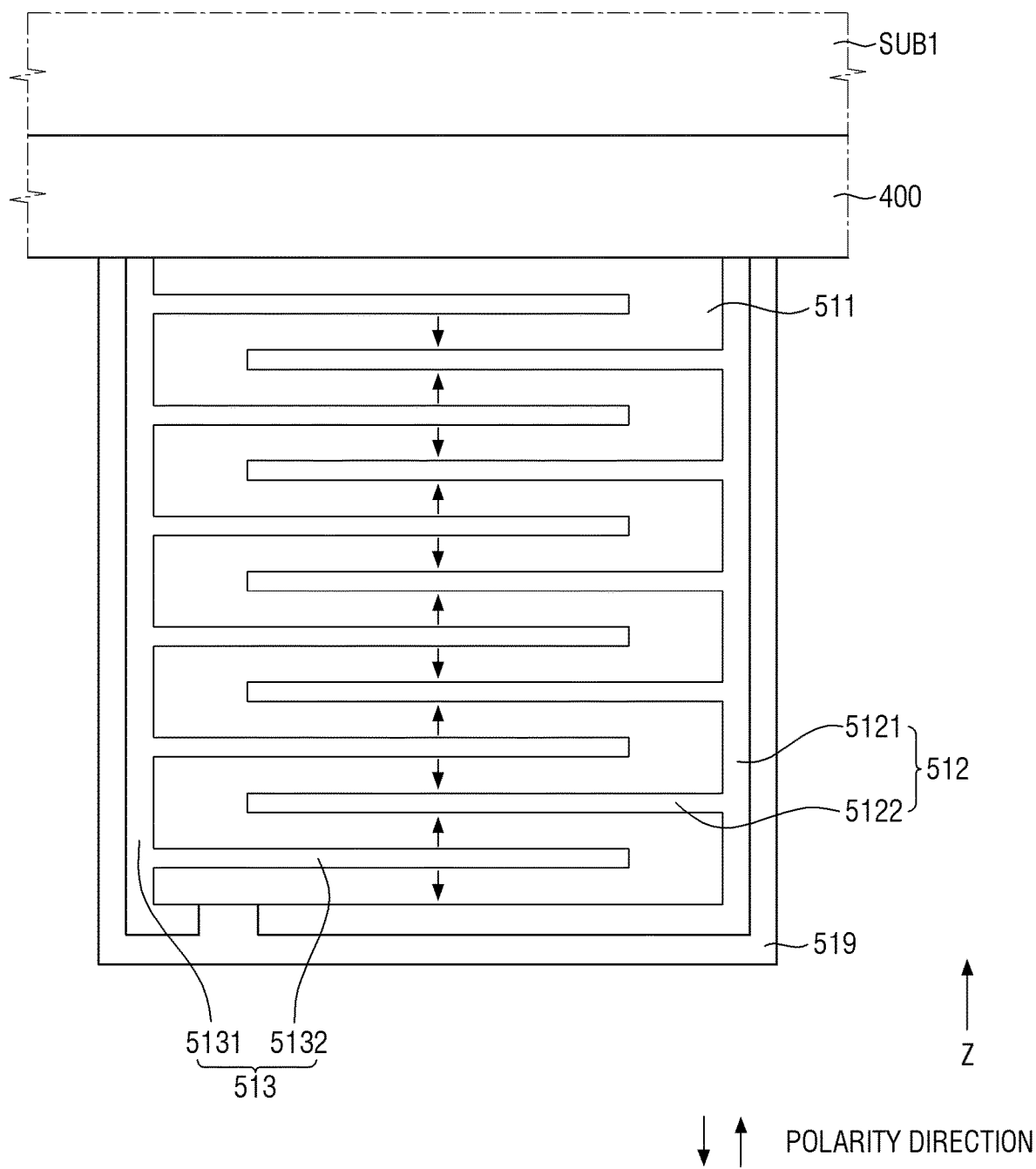
FIG. 7 is a cross-sectional view of an exemplary embodiment of the sound generation device of FIG. 5.
Figure 8:
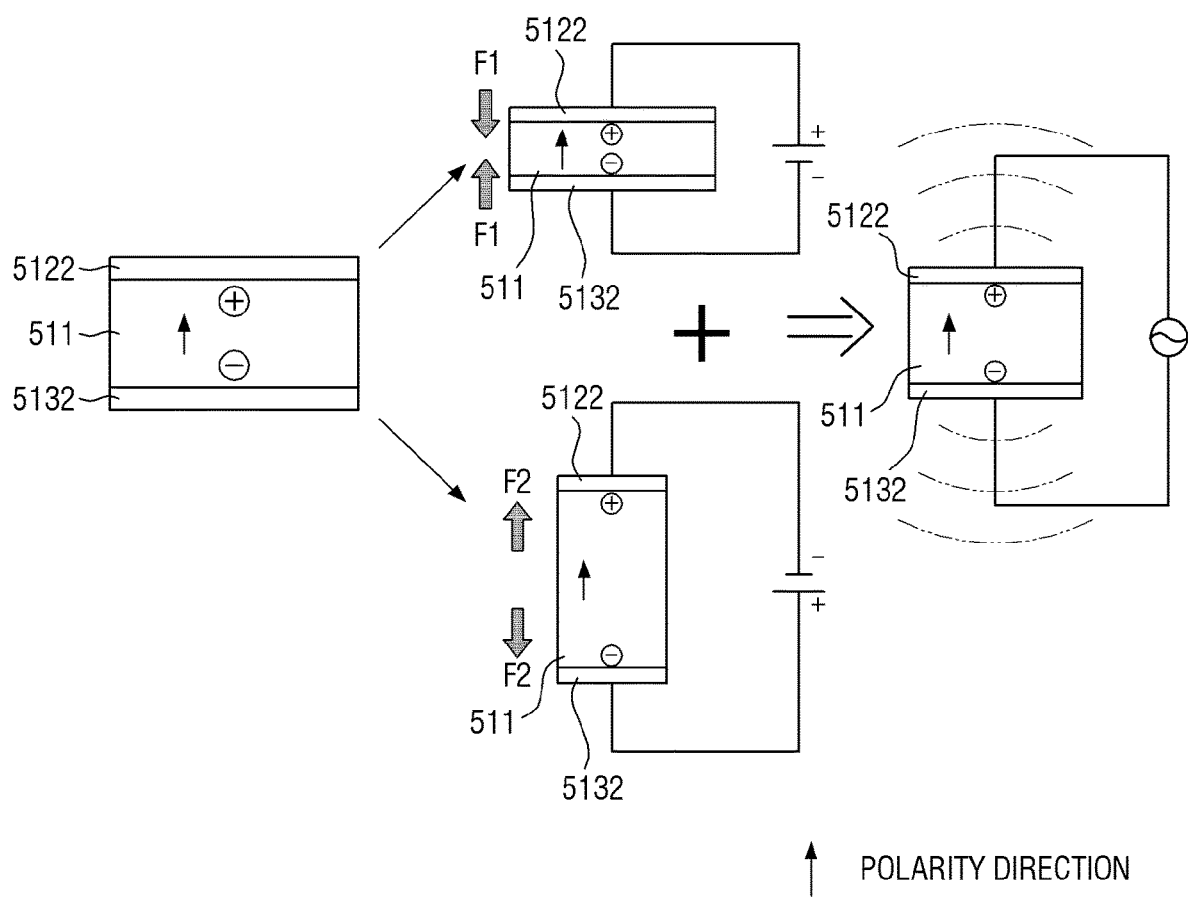
FIG. 8 is a diagrammatic view for illustrating an exemplary vibration method of a vibration layer disposed between a first branch electrode and a second branch electrode of the sound generation device of FIG. 7.

FIG. 7 is a cross-sectional view of an exemplary embodiment of the sound generation device of FIG. 5. FIG. 8 is a diagrammatic view for illustrating an exemplary vibration method of a vibration layer disposed between a first branch electrode and a second branch electrode of the sound generation device of FIG. 7.

Referring to FIGS. 7 and 8, the sound generation device 510 may be a piezoelectric element or a piezoelectric actuator which vibrates the display panel 300 using a piezoelectric material that contracts or expands according to an applied voltage. The sound generation device 510 may include a vibration layer 511, a first electrode 512, and a second electrode 513.

The first electrode 512 may include a first stem electrode 5121 and first branch electrodes 5122. As shown in FIG. 7, the first stem electrode 5121 may be disposed on at least one side surface of the vibration layer 511. Alternatively, the first stem electrode 5121 may be disposed to pass through a portion of the vibration layer 511. The first stem electrode 5121 may also be disposed on an upper surface of the vibration layer 511. The first branch electrodes 5122 may be branched from the first stem electrode 5121. The first branch electrodes 5122 may be disposed in parallel to each other.

The second electrode 513 may include a second stem electrode 5131 and second branch electrodes 5132. The second electrode 513 may be disposed apart from the first electrode 512. Thus, the second electrode 513 may be electrically separated from the first electrode 512. The second stem electrode 5131 may be disposed on at least one side surface of the vibration layer 511. In this case, the first stem electrode 5121 may be disposed on a first side surface of the vibration layer 511, and the second stem electrode 5131 may be disposed on a second side surface of the vibration layer 511. Alternatively, the second stem electrode 5131 may be disposed to pass through a portion of the vibration layer 511. The second stem electrode 5131 may also be disposed on the upper surface of the vibration layer 511. The second branch electrodes 5132 may be branched from the second stem electrode 5131. The second branch electrodes 5132 may be disposed in parallel to each other.

The first branch electrodes 5122 and the second branch electrodes 5132 may be disposed in parallel to each other in a horizontal direction (X-axis direction or Y-axis direction). In addition, the first branch electrodes 5122 and the second branch electrodes 5132 may be alternately disposed in a vertical direction (Z-axis direction). That is, the first branch electrodes 5122 and the second branch electrodes 5132 are disposed in such a manner that the first branch electrode 5122, the second branch electrode 5132, the first branch electrode 5122, and the second branch electrode 5132 may be sequentially and repeatedly disposed in the vertical direction (Z-axis direction).

The first electrode 512 and the second electrode 513 may be electrically connected to pads of the sound circuit board 520. The pads of the sound circuit board 520 may be connected to portions of the first electrode 512 and the second electrode 513 disposed on one surface of the sound generation device 510.

The vibration layer 511 may be a piezoelectric element which is deformed according to a driving voltage applied to the first electrode 512 and a driving voltage applied to the second electrode 513. In this case, the vibration layer 511 may include any one of a poly vinylidene fluoride (PVDF) film, a piezoelectric material such as plumbum zirconate titanate (PZT), and an electroactive polymer.

Since a process temperature of the vibration layer 511 is high, the first electrode 512 and the second electrode 513 may be made of silver (Ag) with a high melting point or an alloy of silver (Ag) and palladium (Pd). When the first electrode 512 and the second electrode 513 are made of an alloy of silver (Ag) and palladium (Pd) to increase a melting point of the first electrode 512 and the second electrode 513, a content of silver (Ag) may be greater than a content of palladium (Pd).

The vibration layer 511 may be disposed between the first branch electrodes 5122 and the second branch electrodes 5132. The vibration layer 511 contracts or expands according to a difference between a driving voltage applied to the first branch electrode 5122 and a driving voltage applied to the second branch electrode 5132.

As shown in FIG. 7, when the polarity direction of the vibration layer 511 disposed between the first branch electrode 5122 and the second branch electrode 5132 disposed below the first branch electrode 5122 is an upward direction (↑), the vibration layer 511 may have a positive polarity in an upper region thereof adjacent to the first branch electrode 5122 and may have a negative polarity in a lower region thereof adjacent to the second branch electrode 5132. In addition, when the polarity direction of the vibration layer 511 disposed between the second branch electrode 5132 and the first branch electrode 5122 disposed below the second branch electrode 5132 is a downward direction (↓), the vibration layer 511 may have a negative polarity in an upper region thereof adjacent to the second branch electrode 5132 and may have a positive polarity in a lower region thereof adjacent to the first branch electrode 5122. The polarity direction of the vibration layer 511 may be determined in a poling process of applying an electric field to the vibration layer 511 using the first branch electrode 5122 and the second branch electrode 5132.

As shown in FIG. 8, in the case where the polarity direction of the vibration layer 511 disposed between the first branch electrode 5122 and the second branch electrode 5132 disposed below the first branch electrode 5122 is an upward direction (↑), when a positive driving voltage may be applied to the first branch electrode 5122 and a negative driving voltage may be applied to the second branch electrode 5132, the vibration layer 511 may contract by a first force F1. The first force F1 may be a contraction force. In addition, when a negative driving voltage may be applied to the first branch electrode 5122 and a positive driving voltage may be applied to the second branch electrode 5132, the vibration layer 511 may expand by a second force F2. The second force F2 may be an extension force.

Similar to FIG. 8, in the case where the polarity direction of the vibration layer 511 disposed between the second branch electrode 5132 and the first branch electrode 5122 disposed below the second branch electrode 5132 is a downward direction (↓), when a positive driving voltage may be applied to the second branch electrode 5132 and a negative driving voltage may be applied to the first branch electrode 5122, the vibration layer 511 may expand by an extension force. In addition, when a negative driving voltage may be applied to the second branch electrode 5132 and a positive driving voltage may be applied to the first branch electrode 5122, the vibration layer 511 may contract by a contraction force.

When a driving voltage applied to the first electrode 512 and a driving voltage applied to the second electrode 513 are alternately repeated between a positive polarity and a negative polarity, the vibration layer 511 repeatedly contracts and expands. As a result, the sound generation device 510 vibrates. Since the sound generation device 510 is disposed on one surface of the panel lower cover 400, when the vibration layer 511 of the sound generation device 510 contracts and expands in a third direction (Z-axis direction), the display panel 300 disposed on the opposing surface of the panel lower cover 400 vibrates due to vibration and/or stress in the third direction which is a thickness direction of the display panel 300.

A protective layer 519 may be additionally disposed on a second surface and side surfaces of the sound generation device 510, as shown in FIG. 7. The protective layer 519 may be made of an insulating material or may be made of the same material as the vibration layer 511. The protective layer 519 may be disposed on the first electrode 512, the second electrode 513, and the vibration layer 511 which is not covered by the first electrode 512 and the second electrode 513 and is exposed. The protective layer 519 may surround the first electrode 512, the second electrode 513, and the vibration layer 511 which is not covered by the first electrode 512 and the second electrode 513 and is exposed. Therefore, the vibration layer 511, the first electrode 512, and the second electrode 513 of the sound generation device 510 may be protected by the protective layer 519. The protective layer 519 may be omitted.

Figure 9:
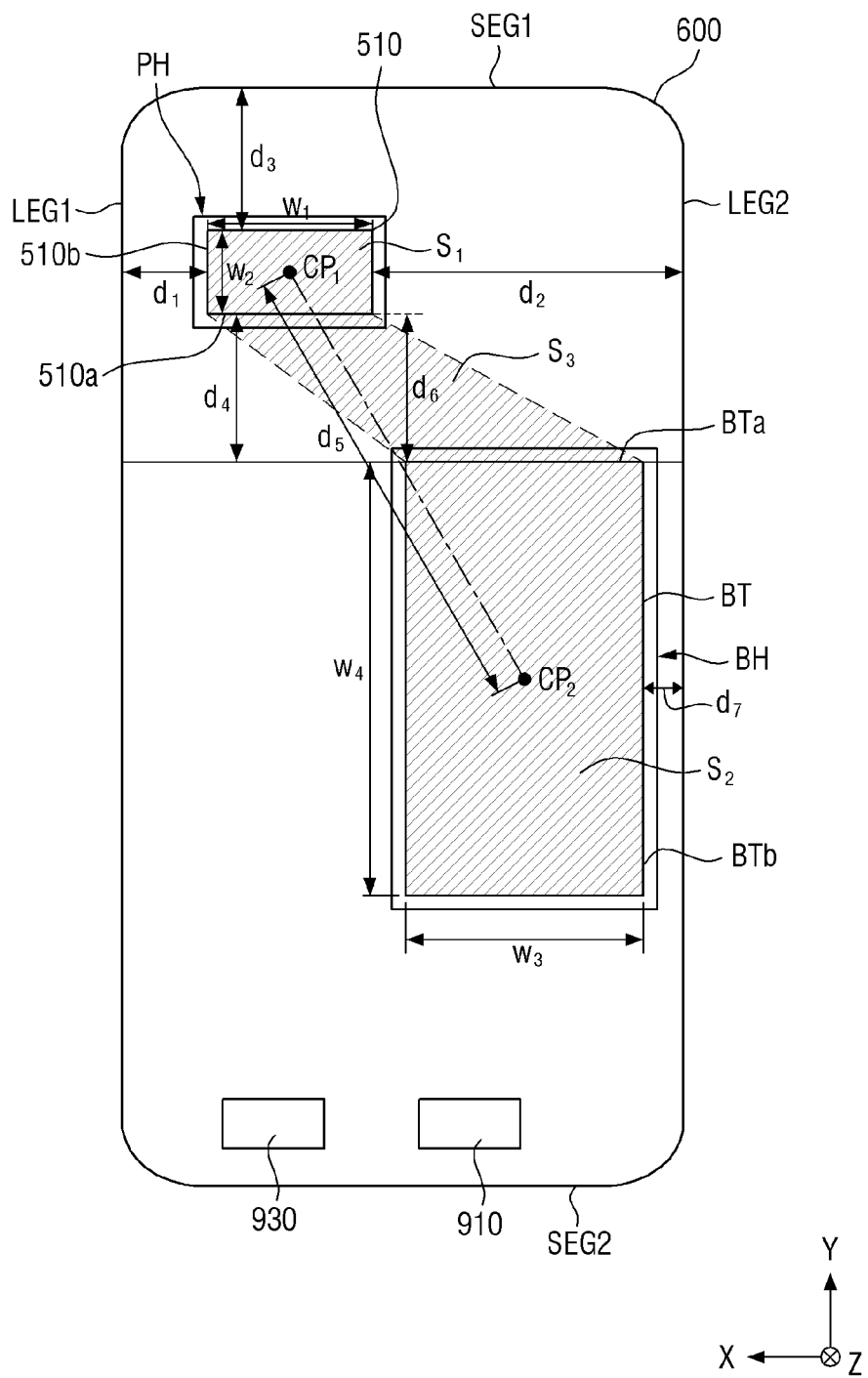
FIG. 9 is a bottom view of an exemplary embodiment of the positional relationship of a bracket, a sound generation device, and a battery constructed according to the principles of the invention.
Figure 10:
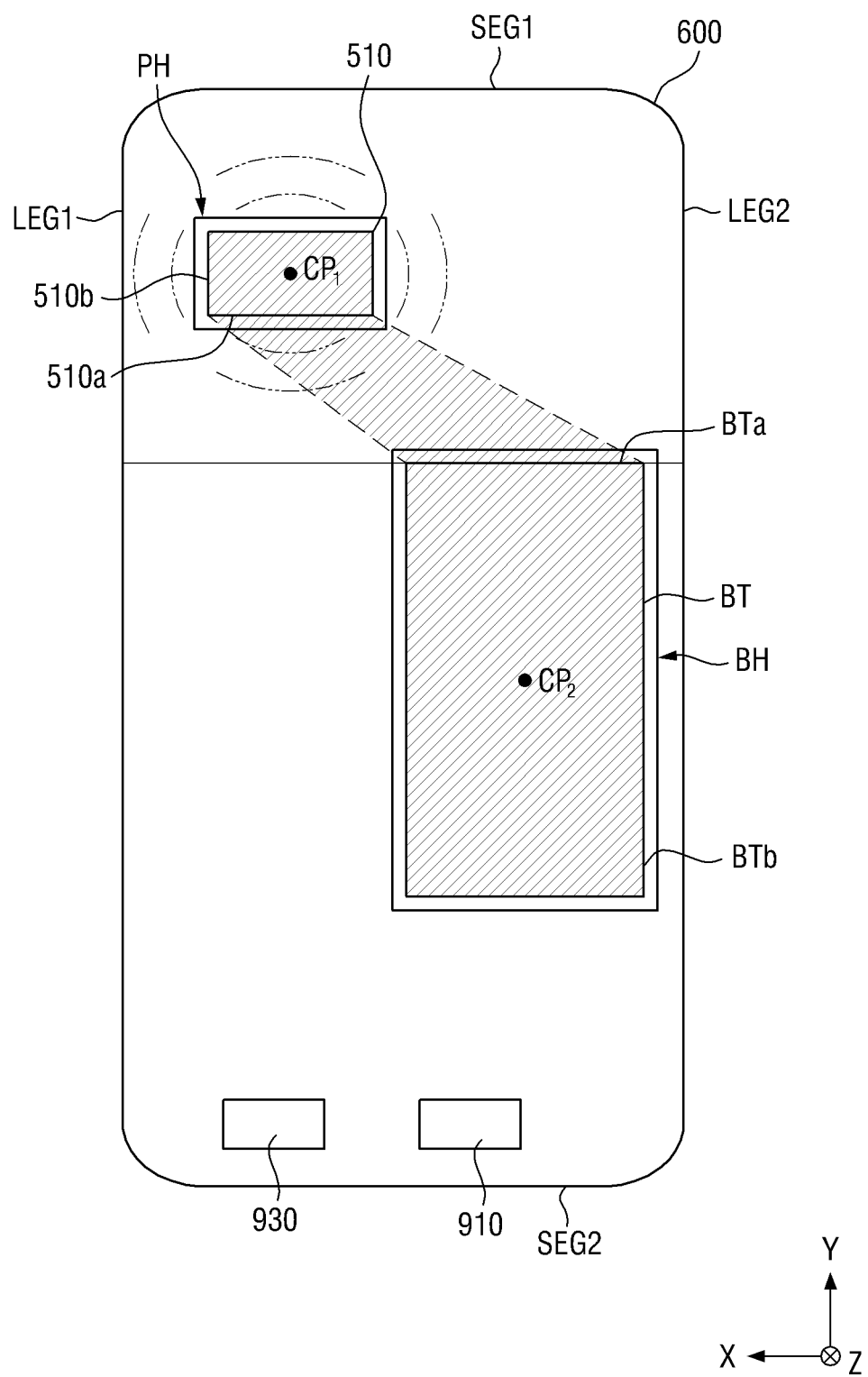
FIG. 10 is a view illustrating that acoustic performance is maximized according to the planar arrangement of the bracket, the sound generation device, and the battery of FIG. 9.

FIG. 9 is a bottom view of an exemplary embodiment of the positional relationship of a bracket, a sound generation device, and a battery constructed according to the principles of the invention. FIG. 10 is a view illustrating that acoustic performance is maximized according to the planar arrangement of the bracket, the sound generation device, and the battery of FIG. 9.

Referring to FIG. 9, the bracket 600 may have a planar shape such as generally rectangular shape to match the shape of the display device. When the bracket 600 has a generally rectangular shape, the bracket 600 may include first and second short side edges SEG1 and SEG2 extending in the first direction (X-axis direction) and first and second long side edges LEG1 and LEG2 extending in the second direction (Y-axis direction). A corner at which the short side edge meets the long side edge may be rounded as shown in FIG. 9. However, exemplary embodiments are not limited thereto, and the corner may be angled.

The first long side edge LEG1 is located at the left side of the bracket 600, the second long side edge LEG2 is opposite to the first long side edge LEG1 and located at the right side of the bracket 600, the first short side edge SEG1 is located at the upper side of the bracket 600, and the second short side edge SEG2 is opposite to the first short side edge SEG1 and located at the lower side of the bracket 600.

When viewed in plane, the sound generation device 510 may be disposed between the battery BT and the first short side edge SEG1, and the battery BT may be disposed between the sound generation device 510 and the second short side edge SEG2.

As described above, the bracket 600 may have the first hole PH and the second hole BH spaced apart from the first hole PH. The sound generation device 510 may be disposed in the first hole PH, and the battery BT may be disposed in the second hole BN.

The sound generation device 510 may have a planar shape such as generally rectangular shape to match the shape of the hole PH. The sound generation device 510 may have a long side 510a extending in the first direction (X-axis direction) and a short side 510b extending in the second direction (Y-axis direction). The corner at which the long side 510a meets the short side 510b may be angled. The long side 510a of the sound generation device 510 may have a first width W1, and the short side 510b of the sound generation device 510 may have a second width W2. The first width W1 may be greater than the second width W2. The sound generation device 510 may have a first area S1.

However, exemplary embodiments are not limited thereto, and the long side 510a of the sound generation device 510 may extend in the second direction (Y-axis direction), and the short side 510b thereof may extend in the first direction (X-axis direction).

In some exemplary embodiments, the sound generation device 510 may have a shape different from the rectangular shape. For example, the sound generation device 510 may have a square shape, a circular shape, an elliptical shape, or other polygonal shapes.

The battery BT may have a generally rectangular shape like the sound generation device 510. The battery BT may have a short side BTa extending in the first direction (X-axis direction) and a long side BTb extending in the second direction (Y-axis direction). The corner at which the short side BTa meets the long side BTb may be angled. The short side BTa of the battery BT may have a third width W3, and the long side BTb of the battery BT may have a fourth width W4. The third width W3 may be smaller than the fourth width W4. The battery BT may have a second area S2.

However, exemplary embodiments are not limited thereto, and the short side BTa of the battery BT may extend in the second direction (Y-axis direction), and the long side BTb thereof may extend in the first direction (X-axis direction).

In some exemplary embodiments, battery BT may have a shape different from the rectangular shape. For example, the battery BT may have a square shape, a circular shape, an elliptical shape, or other polygonal shapes.

The first and second holes PH and BH of the bracket 600 corresponding to the battery BT and the sound generation device 510 may be larger than planar sizes of the battery BT and the sound generation device 510, respectively. That is, the planar size of the first hole PH of the bracket 600 may be larger than the planar size of the sound generation device 510, and thus, the sound generation device 510 may be disposed in the first hole PH in a plan view. The planar size of the second hole BH of the bracket 600 may be larger than the planar size of the battery BT, and thus, the battery BT may be disposed in the second hole BH in a plan view. The shapes of the first hole PH and the second hole BH may be the same or substantially similar to the planar shape of the sound generation device 510 and the planar shape of the battery BT. The planar sizes of the first hole PH and the second hole BH only need to be slightly larger than those of the sound generation device 510 and the battery BT, and the shapes of the first hole PH and the second hole BH are not limited.

The sound generation device 510 may be disposed closer to the first short side edge SEG1 than the battery BT. The earphone port device 910 and the speaker 930 may be disposed closer to the second short side edge SEG2 than the battery BT in a plan view.

In order for the sound generation device 510 to generate sound pressure greater than or equal to a reference at a specific frequency, a few factors that impede and/or interfere with vibration need to be minimized. The factors that impede and/or interfere with the vibration of the sound generation device 510 may be the battery BT, the bracket 600, and the like. The battery BT has relatively great weight. When the sound generation device 510 is disposed adjacent to the battery BT, the vibration of the sound generation device 510 may be impeded and/or interfered with due to the relatively great weight of the battery BT.

Therefore, to reduce or prevent the vibration of the sound generation device 510 from being impeded and/or interfered with by the battery BT, the sound generation device 510 may be disposed adjacent to the first long side edge LEG1 and the first short side edge SEG1 of the bracket 600, and the battery BT may be disposed adjacent to the second long side edge LEG2 and the second short side edge SEG2 of the bracket 600, thereby increasing the separation distance between the sound generation device 510 and the battery BT.

In addition, in case where the sound generation device 510 is disposed closely adjacent to the first long side edge LEG1 and first short side edge SEG1 of the bracket 600, the first long side edge LEG1 and the first short side edge SEG1 may be relatively less likely to vibrate as compared with a central portion of the bracket 600. In this case, the vibration of the sound generation device 510 may be impeded.

Therefore, to reduce or preventing the vibration of the sound generation device 510 from being impeded and/or interfered with by the sides LEG1 and SEG1, the sound generation device 510 may appropriately spaced apart from the adjacent first short side edge SEG1 and the adjacent first long side edge LEG1.

More specifically, the sound generation device 510 may be disposed at a first separation distance d1 from the first long side edge LEG1 of the bracket 600, may be disposed at a second separation distance d2 from the second long side edge LEG2 of the bracket 600, and may be disposed at a third separation distance d3 from the first short side edge SEG1 of the bracket 600. The battery BT may be disposed at a seventh separation distance d7 from the second long side edge LEG2 of the bracket 600. The short sides BTa of the battery BT may include an upper short side adjacent to the sound generation device 510 and a lower short side opposite to the upper short side. The sound generation device 510 may be disposed at a fourth separation distance d4 from an extension line of the upper short side of the battery BT. In addition, the sound generation device 510 may have a first central point CP1 located in a center thereof in a plan view, and the battery BT may have a second central point CP2 located at a center thereof in a plan view. The first central point CP1 of the sound generation device 510 may be disposed at a fifth separation distance d5 from the second central point CP2 of the battery BT. In addition, the sound generation device 510 may be disposed at a sixth separation distance d6 from the battery BT.

The separation distances d1 to d6 may each refer to a linear separation distance in which the distance from a start point to an end point is the shortest. That is, the first separation distance d1 may be a minimum separation distance between the sound generation device 510 and the first long side edge LEG1 of the bracket 600. The second separation distance d2 may be a minimum separation distance between the sound generation device 510 and the second long side edge LEG2. The third separation distance d3 may be a minimum separation distance between the sound generation device 510 and the first short side edge SEG1. The fourth separation distance d4 may be a minimum separation distance between the sound generation device 510 and the extension line of the upper long side of the battery BT. The fifth separation distance d5 may be a minimum separation distance between the first central point CP1 and the second central point CP2. The sixth separation distance d6 may be a minimum separation distance between the sound generation device 510 and the battery BT. The seventh separation distance d7 may be a minimum separation distance between the battery BT and the second long side edge LEG2.

The second separation distance d2 may range from about 1.2 times to about 9 times the first separation distance d1. When the second separation distance d2 is less than about 1.2 times the first separation distance d1, the separation distance between the sound generation device 510 and the battery BT may be too short. Thus, vibration defects of the sound generation device 510 may be caused due to the weight of the battery BT. In addition, when the second separation distance d2 is more than about 9 times the first separation distance d1, vibration defects of the sound generation device 510 may be caused due to the first long side edge LEG1 which is relatively fixed and relatively hard to vibrate. Accordingly, the second separation distance d2 may range from about 1.2 times to about 9 times the first separation distance d1.

In addition, the third separation distance d3 may range from about 0.8 times to about 1.2 times the fourth separation distance d4. When the third separation distance d3 is less than about 0.8 times the fourth separation distance d4, the sound generation device 510 may be disposed adjacent to the first short side edge SEG1, and thus, vibration defects may be caused due to the first short side edge SEG1 which is relatively fixed and relatively hard to vibrate. In addition, when the third separation distance d3 is more than about 1.2 times the fourth separation distance d4, the sound generation device 510 may be disposed adjacent to the battery BT, and thus, vibration defects may be caused due to the battery BT. Thus, the third separation distance d3 may range from about 0.8 times to about 1.2 times the fourth separation distance d4.

Furthermore, the sixth separation distance d6 may be greater than each of the first separation distance d1 and the seventh separation distance d7.

The fifth separation distance d5 may be greater than or equal to about 1.5 times the third width W3 of the short side BTa of the battery BT and may be greater than or equal to about 1.5 times the fourth width W4 of the long side BTb of the battery BT. Accordingly, the sound generation device 510 may be disposed to be spaced apart from the battery BT as far as possible, thereby reducing or preventing vibration defects of the sound generation device 510.

In addition, a region between the battery BT and the sound generation device 510 may have a third area S3. The third area S3 may be greater than the first area S1 and smaller than the second area S2. The region between the battery BT and the sound generation device 510 may refer to a region of a quadrangle defined by the upper short side of the battery BT and a lower long side of the sound generation device 510, and sides formed by straight lines extending between the lower left corner of the sound generation device 510 and the upper left corner of the battery BH on the left side and between the lower right corner of the sound generation device 510 and the upper right corner of the battery BH on the right side.

The sound generation device 510 may be positioned in consideration of the battery BT and the bracket 600 as in the illustrated embodiment, thereby reducing or preventing vibrations defects of the sound generation device 510 as shown schematically in FIG. 10 and easily obtaining desired sound pressure at a specific frequency.

Figure 11:
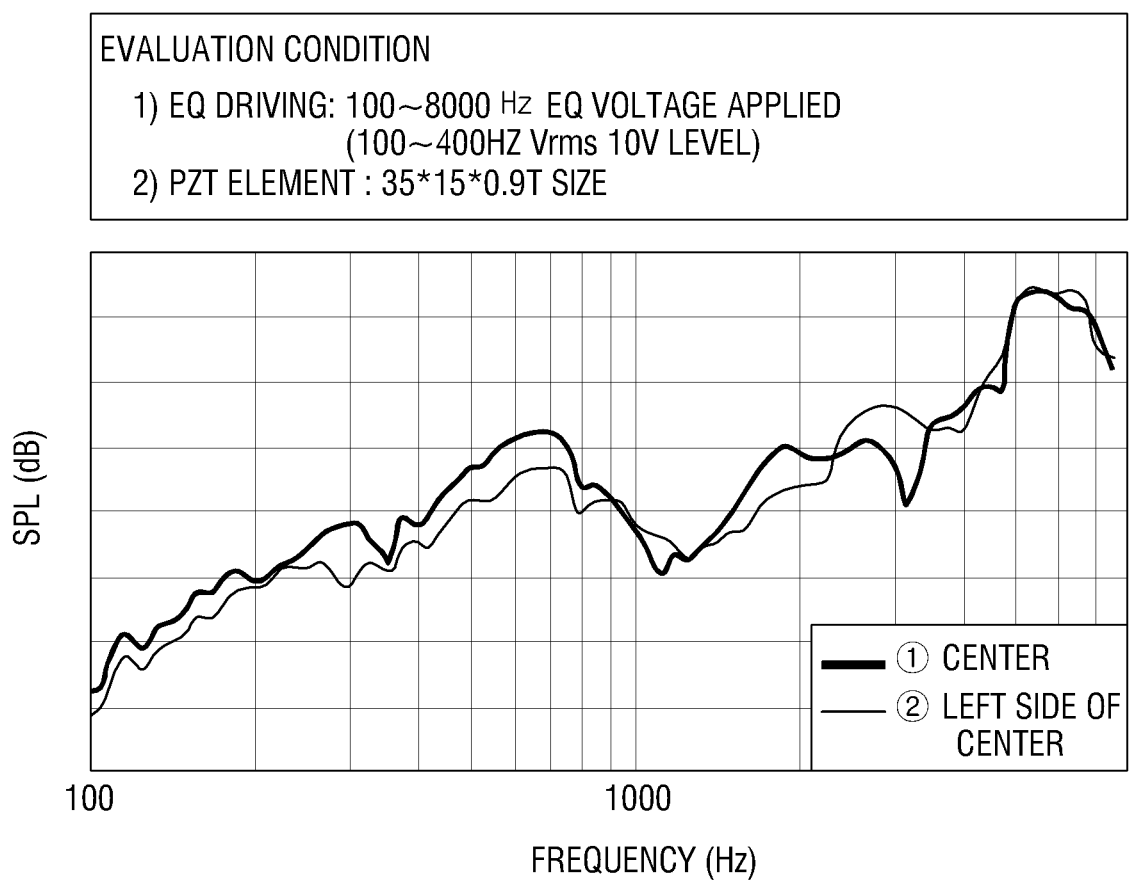
FIG. 11 is a graph showing sound pressure according to the illustrated exemplary embodiment and sound pressure according to a comparative embodiment.

FIG. 11 is a graph showing sound pressure according to the illustrated exemplary embodiment and sound pressure according to a comparative embodiment. In the graph of FIG. 11, the horizontal axis denotes frequency (Hz), and the vertical axis denotes sound pressure SPL (dB). Also, the term "center" in a legend denotes a case in which the sound generation device is positioned to overlap a central portion of the battery BT in the second direction (Y-axis direction), and the term "left side of the center" in the legend denotes a case in which the sound generation device 510 is positioned to not overlap the central portion of the battery BT in the second direction (Y-axis direction) as in the illustrated embodiment. FIG. 11 shows a case in which a voltage level of 10 V is applied to each of the two sound generation devices in a frequency region of 100 Hz to 8,000 Hz. Furthermore, the first width W1 of the sound generation device 510 is 35 mm, the second width W2 thereof is 15 mm, and a thickness thereof is 0.9 T.

Referring to FIG. 11, when the vibration generation device 510 is disposed at the left side of the center, it may be confirmed that sound pressure is high throughout a frequency range as compared with when the vibration generation device is disposed at the central portion.

Hereinafter, display devices according to other exemplary embodiments will be described. In the following exemplary embodiments, the same reference numerals will be given to the same components as the illustrated embodiments described above, and descriptions thereof will be omitted or simplified to avoid redundancy.

Figure 12:
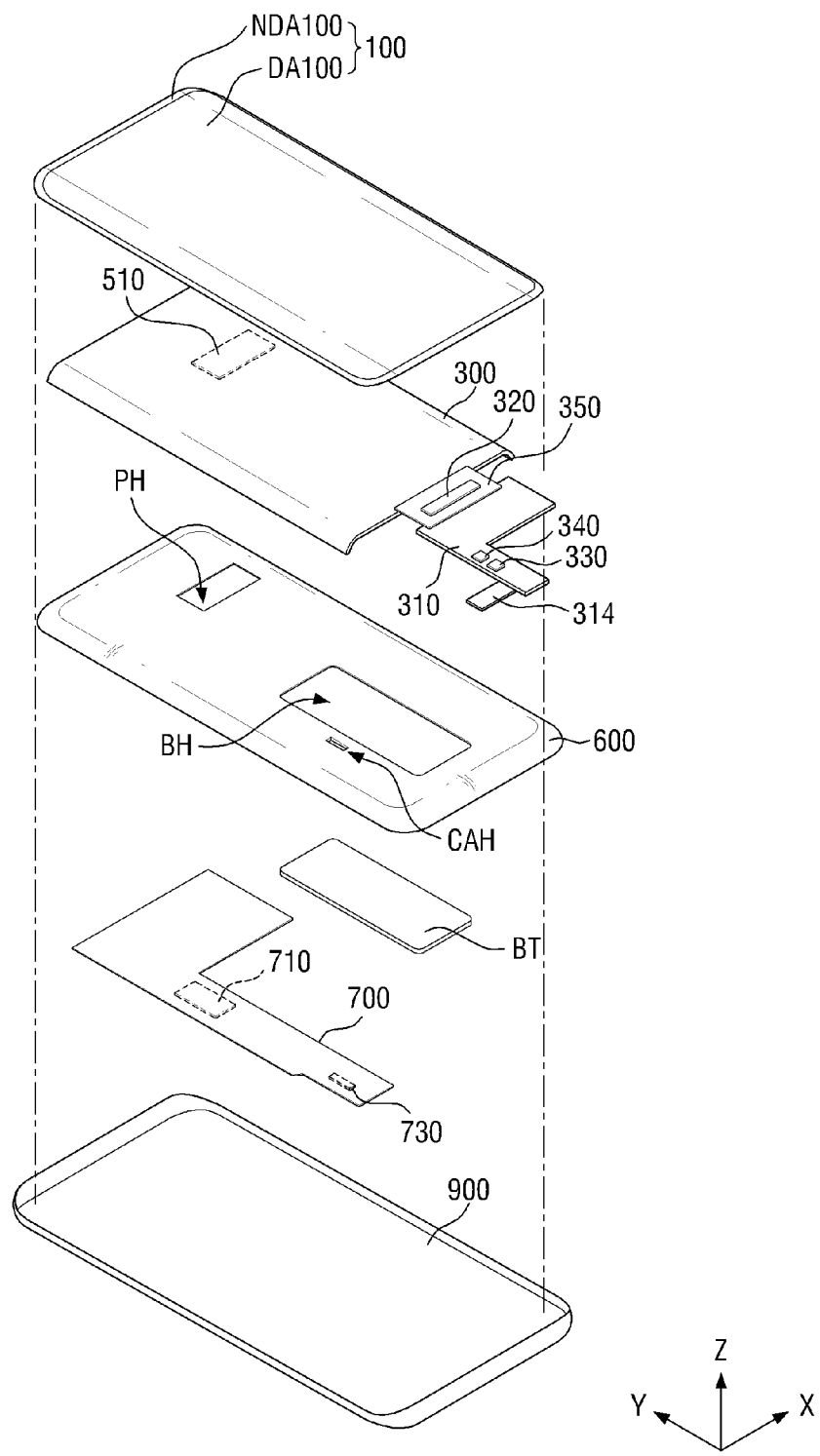
FIG. 12 is an exploded perspective view of another exemplary embodiment of a display device constructed according to the principles of the invention.
Figure 13:
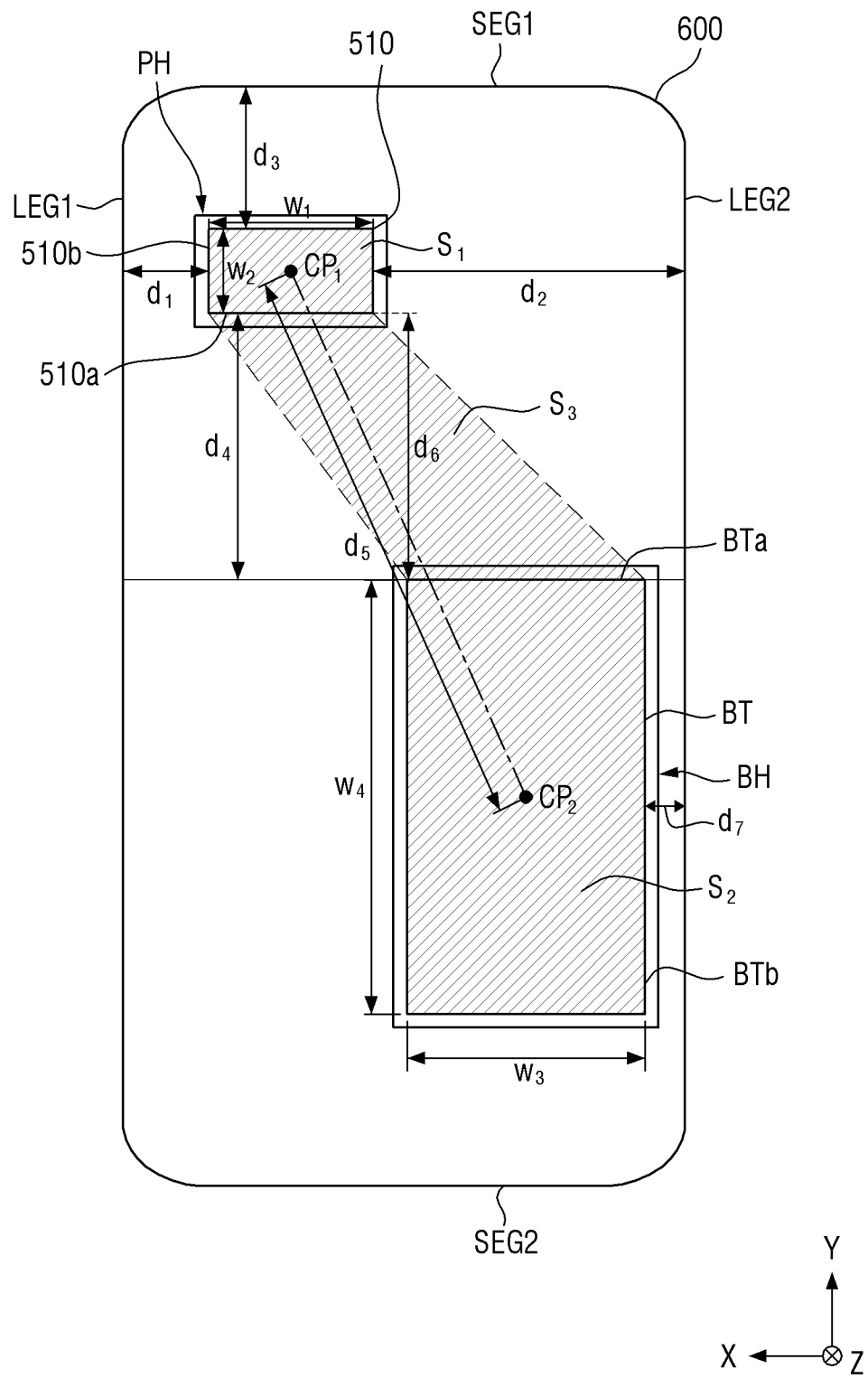
FIG. 13 is a bottom view of another exemplary embodiment of the positional relationship of a bracket, a sound generation device, and a battery constructed according to the principles of the invention.

FIG. 12 is an exploded perspective view of another exemplary embodiment of a display device constructed according to the principles of the invention. FIG. 13 is a bottom view of another exemplary embodiment of the positional relationship of a bracket, a sound generation device, and a battery constructed according to the principles of the invention.

Referring to FIGS. 12 and 13, the display device is different from the display device of FIGS. 2 and 9 in that an earphone port device and a speaker are not provided on a lower cover 900 and a battery BT is disposed closer to a second short side edge SEG2.

More specifically, the display device may receive and transmit sound data such as a voice through Bluetooth, and thus, the earphone port device and the speaker may be omitted and a sound generation device 510 may replace the speaker.

In this manner, the battery BT may be disposed in a region of the earphone port device and the speaker omitted. That is, the separation distance between the battery BT and the second short side edge SEG2 may be smaller than the separation distance between the battery BT and the second short side edge SEG2 of FIG. 9. Accordingly, the separation distance between the battery BT and the sound generation device 510 may be increased.

The sound generation device 510 may be disposed to not overlap the battery BT in a second direction (Y-axis direction). The positional relationship of the sound generation device 510 in consideration of the battery BT and a bracket 600 has been described, and thus redundant descriptions thereof will be omitted.

Figure 14:
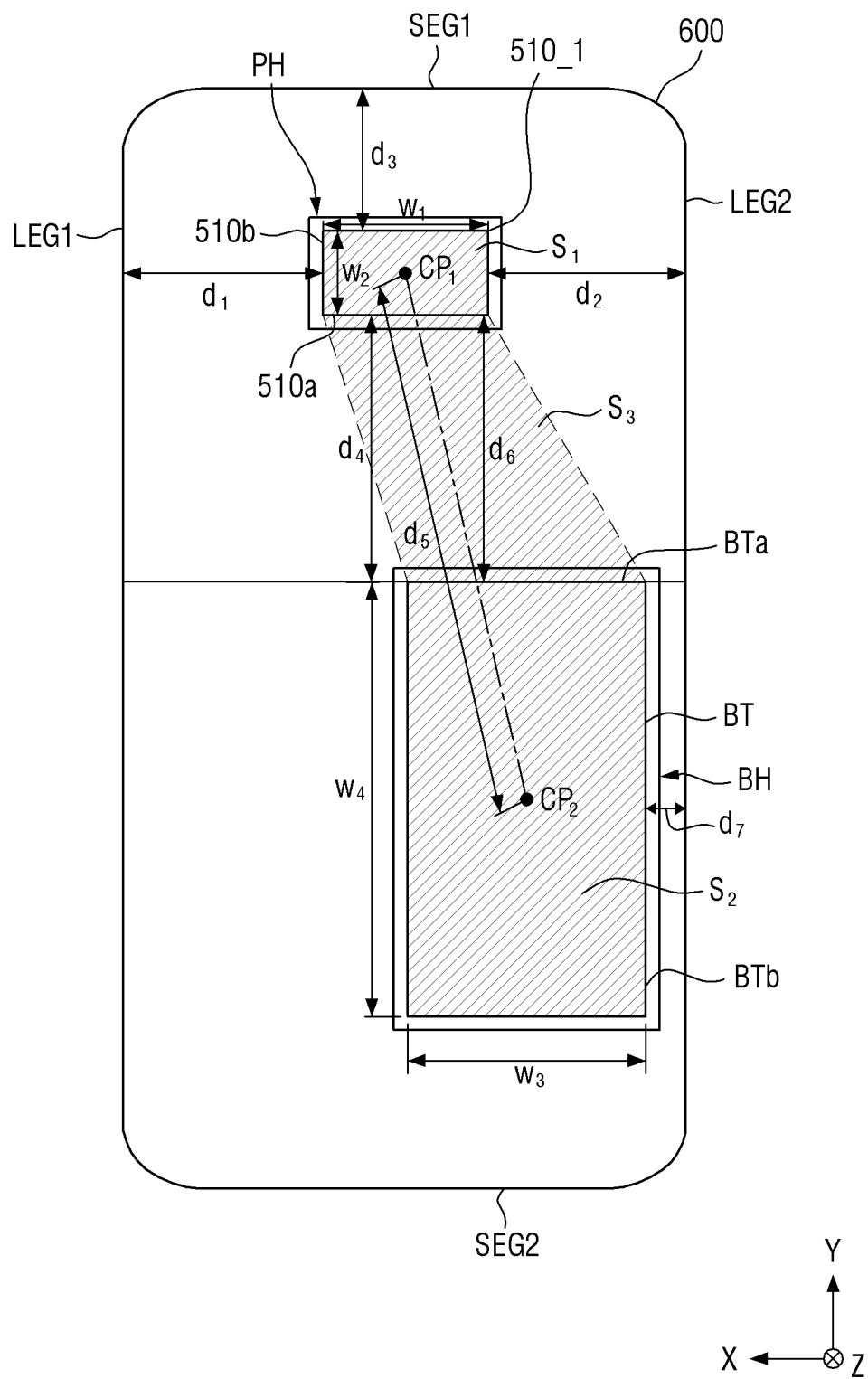
FIG. 14 is a bottom view of still another exemplary embodiment of the positional relationship of a bracket, a sound generation device, and a battery.

FIG. 14 is a bottom view of still another exemplary embodiment of the positional relationship of a bracket, a sound generation device, and a battery.

Referring to FIG. 14, the display device is different from the display device of FIG. 13 in that a sound generation device 510_1 partially overlaps a battery BT in a second direction (Y-axis direction).

Other descriptions have been provided, and thus, redundant descriptions will be omitted below to avoid redundancy.

Figure 15:
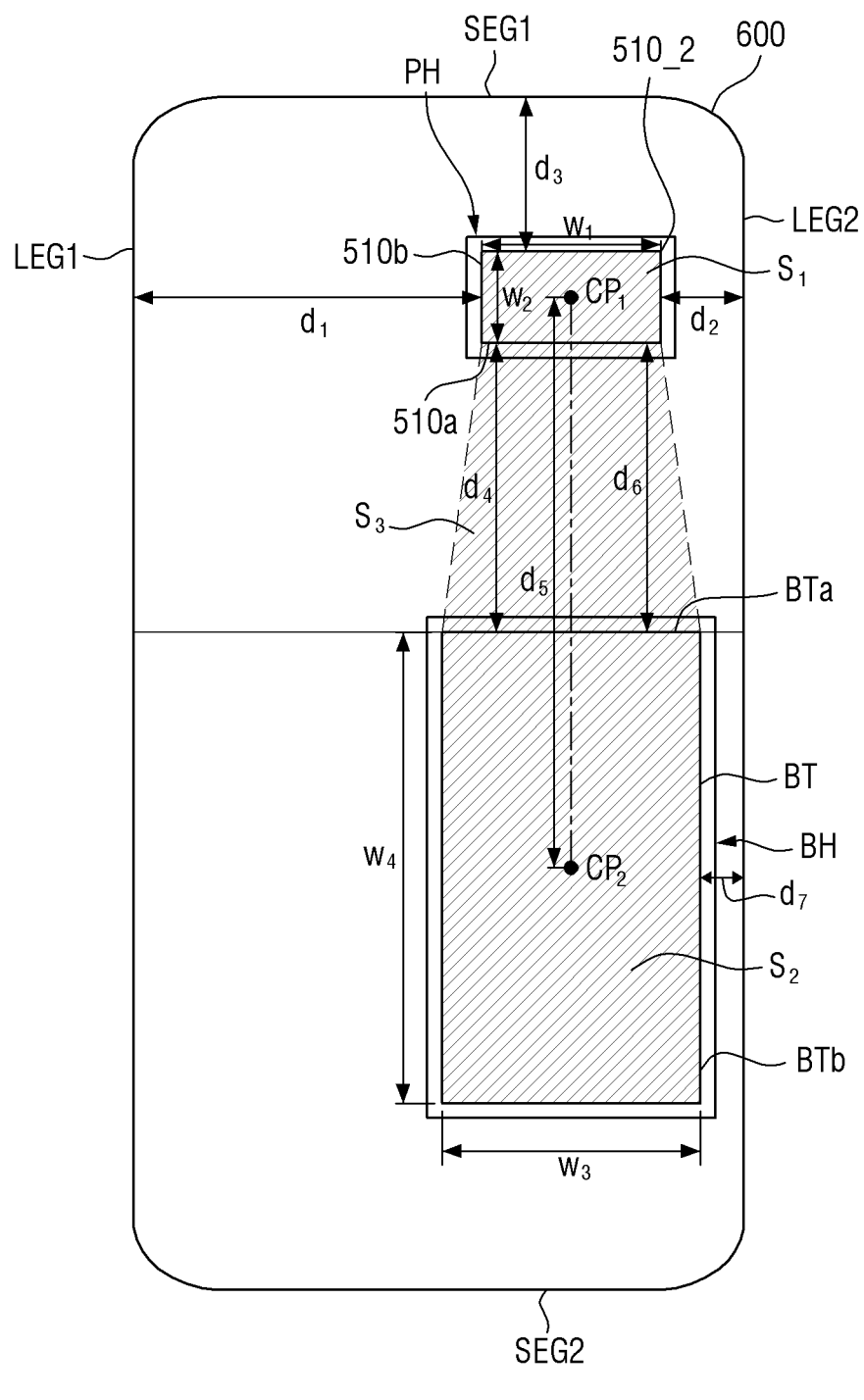
FIG. 15 is a bottom view of yet another exemplary embodiment of the positional relationship of a bracket, a sound generation device, and a battery.

FIG. 15 is a bottom view of yet another exemplary embodiment of the positional relationship of a bracket, a sound generation device, and a battery.

Referring to FIG. 15, the display device is different from the display device of FIG. 14 in that a sound generation device 510_2 completely overlaps a battery BT in a second direction (Y-axis direction).

Other descriptions have been provided, and thus, redundant descriptions will be omitted below to avoid redundancy.

Figure 16:
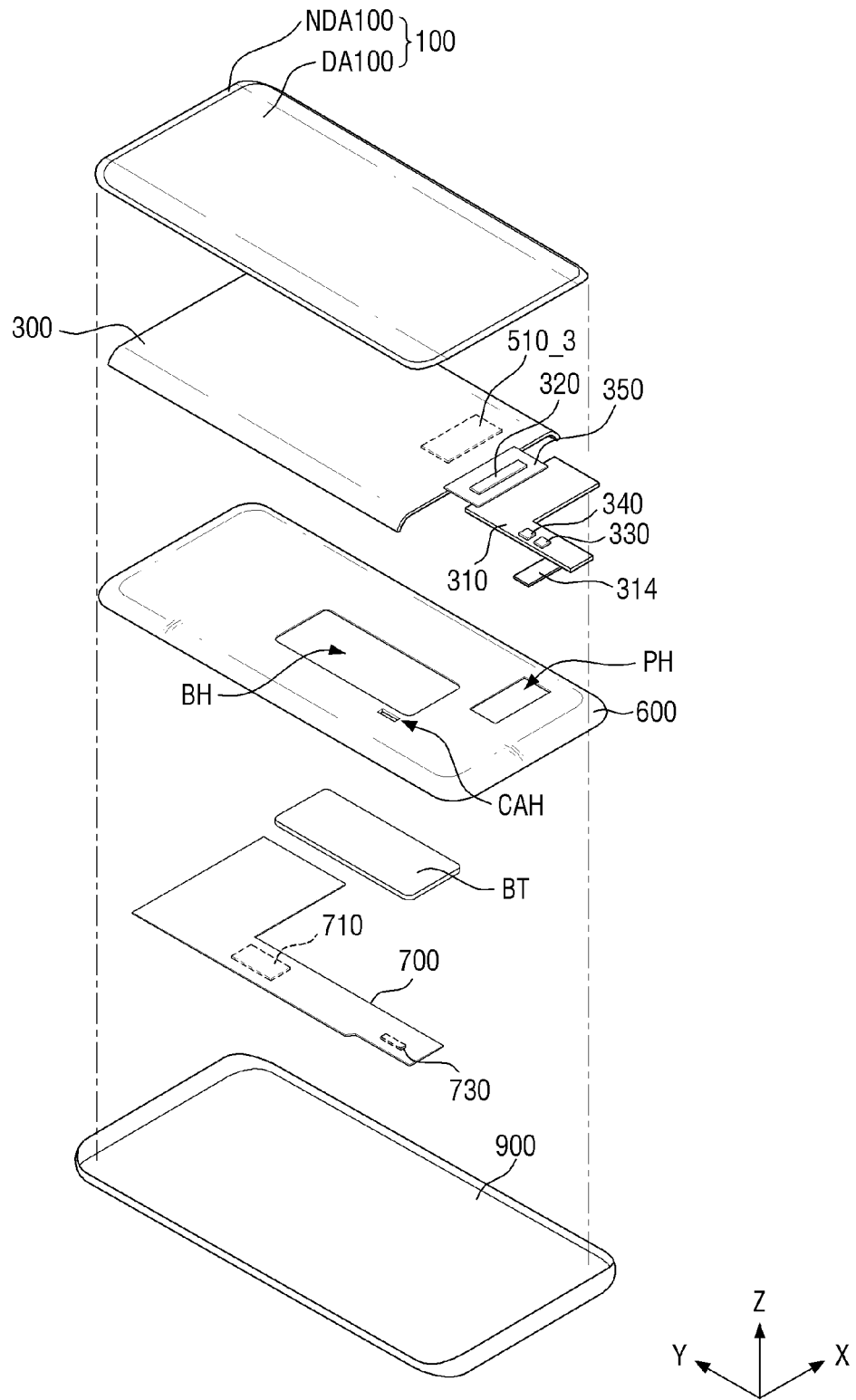
FIG. 16 is an exploded perspective view of still another exemplary embodiment of a display device constructed according to the principles of the invention.
Figure 17:
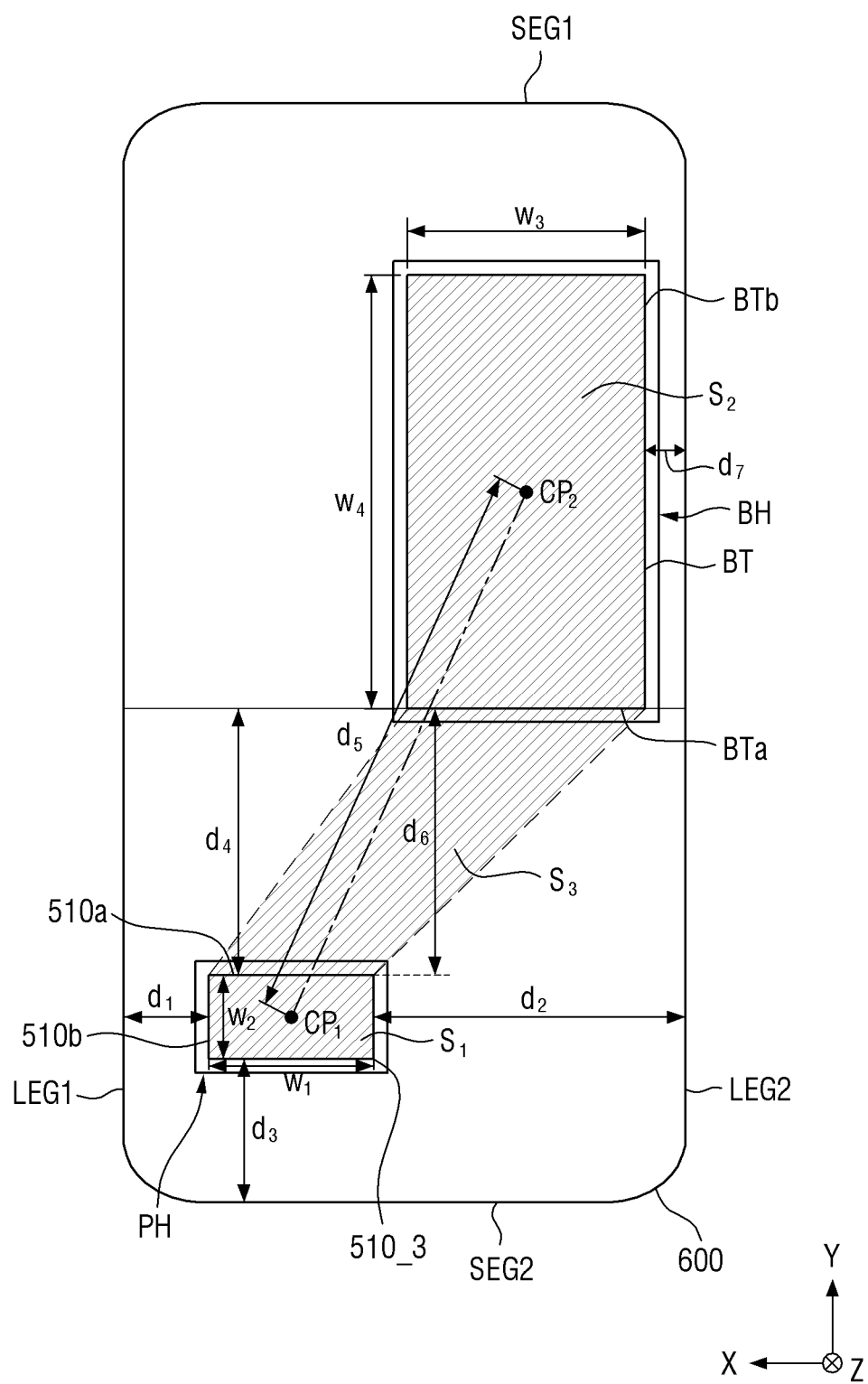
FIG. 17 is a bottom view of still yet another exemplary embodiment of the positional relationship of a bracket, a sound generation device, and a battery.

FIG. 16 is an exploded perspective view of still another exemplary embodiment of a display device constructed according to the principles of the invention. FIG. 17 is a bottom view of still yet another exemplary embodiment of the positional relationship of a bracket, a sound generation device, and a battery.

Referring to FIGS. 16 and 17, the display device is different from the display device of FIGS. 2 and 9 in that a sound generation device 510_3 is disposed between a battery BT and a second short side edge SEG2 and an earphone port device and a speaker are omitted as in FIG. 12.

More specifically, the sound generation device 510_3 may be positioned between the battery BT and the second short side edge SEG2. The sound generation device 510_3 may be positioned to not overlap the battery BT in a second direction (Y-axis direction).

The sound generation device 510_3 may be disposed at a position at which the earphone port device and the speaker are omitted.

The positional relationship of the sound generation device 510_3 in consideration of the battery BT and a bracket 600 has been described, and thus redundant descriptions thereof will be omitted to avoid redundancy.

Figure 18:
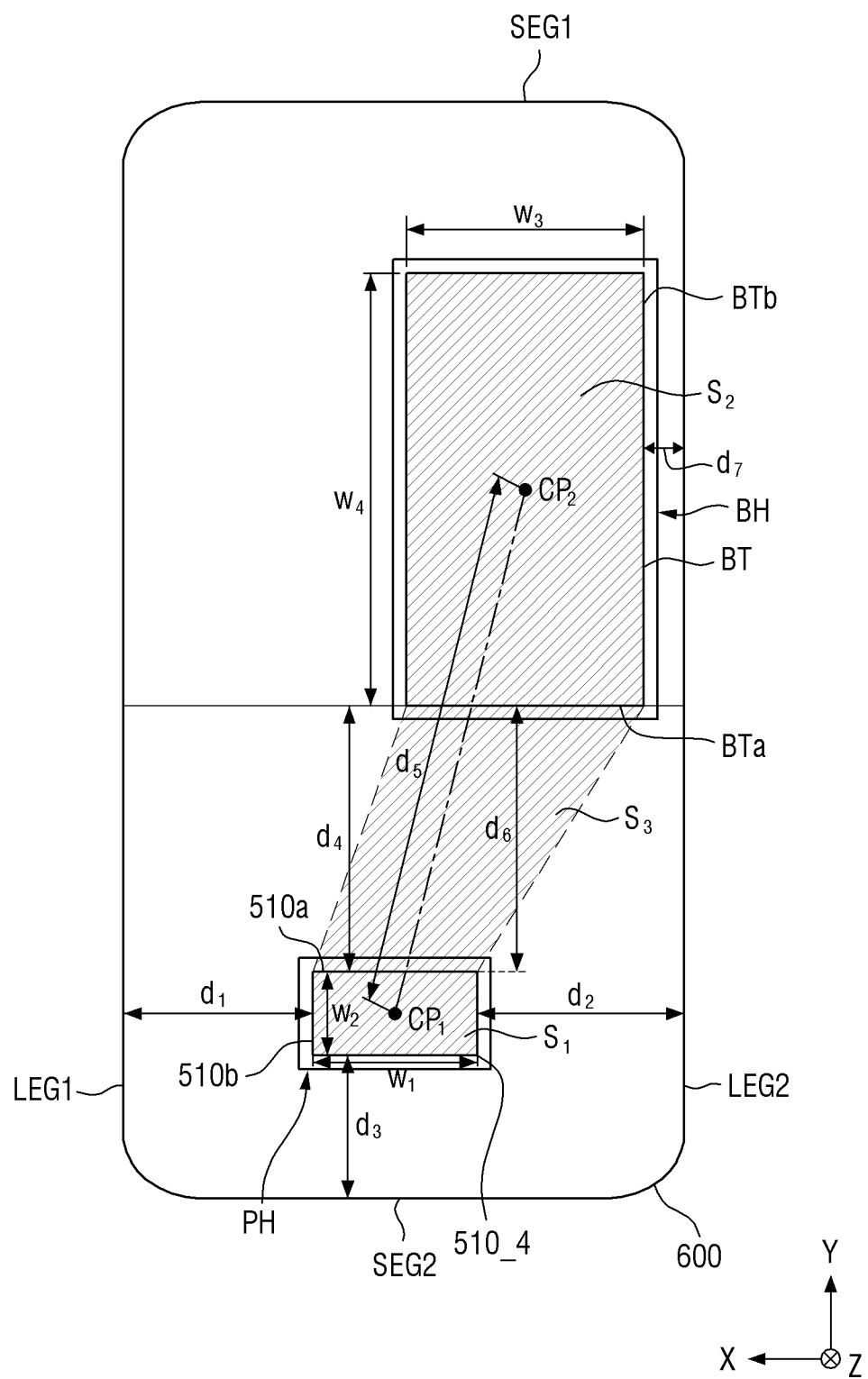
FIG. 18 is a bottom view of still another exemplary embodiment of the positional relationship of a bracket, a sound generation device, and a battery.

FIG. 18 is a bottom view of still another exemplary embodiment of the positional relationship of a bracket, a sound generation device, and a battery.

Referring to FIG. 18, the display device is different from the display device of FIG. 17 in that a sound generation device 510_4 partially overlaps a battery BT in a second direction (Y-axis direction).

Other descriptions have been provided, and thus, redundant descriptions will be omitted to avoid redundancy.

Figure 19:
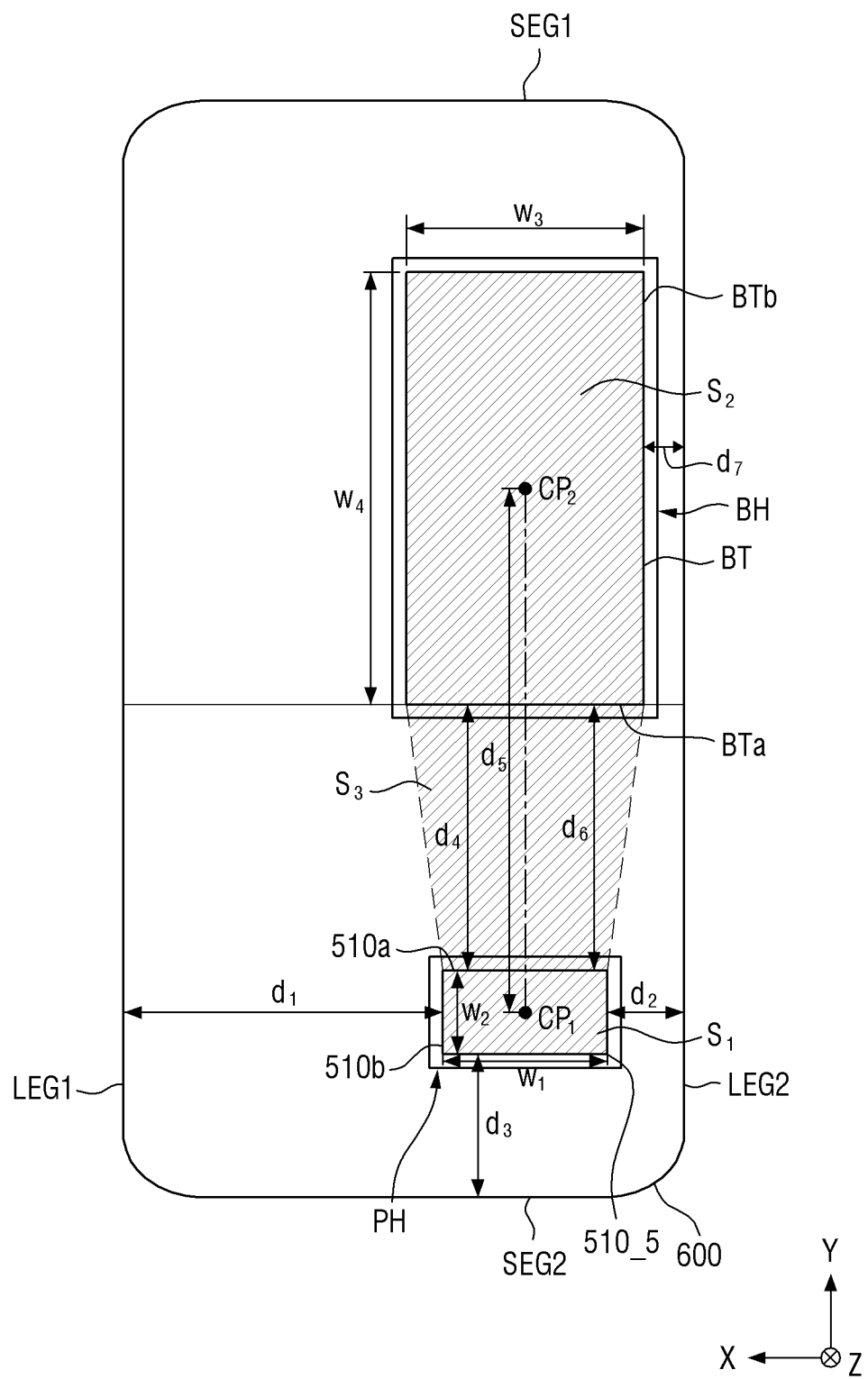
FIG. 19 is a bottom view of yet another exemplary embodiment of the positional relationship of a bracket, a sound generation device, and a battery.

FIG. 19 is a bottom view of yet another exemplary embodiment of the positional relationship of a bracket, a sound generation device, and a battery.

Referring to FIG. 19, the display device is different from the display device of FIG. 17 in that a sound generation device 510_5 completely overlaps a battery BT in a second direction (Y-axis direction).

Other descriptions have been provided, and thus, redundant descriptions will be omitted to avoid redundancy.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel;
   a frame disposed on the display panel and having a first hole and a second hole spaced apart from the first hole;
   a vibration device disposed on the display panel and received in the first hole; and
   a battery disposed on the display panel and received in the second hole, wherein the frame has a first long side edge extending in a first direction, a second long side edge opposite to the first long side edge, a first short side edge extending in a second direction generally orthogonal to the first direction and disposed between the first and second long side edges, and a second short side edge opposite to the first short side edge, the first and second holes are located in the frame without overlapping each other in the second direction, the vibration device is disposed adjacent to the first long side edge by a first linear distance and adjacent to the second long side edge by a second linear distance greater than the first linear distance, and the battery is disposed adjacent to the second long side edge by a third linear distance less than the second linear distance.

2. The display device of claim 1, wherein the vibration device is disposed adjacent to the first short side edge, and the battery is disposed adjacent to the second short side edge.

3. The display device of claim 2, wherein the frame comprises a bracket including the first and second long side edges and the first and second short side edges, and a fourth linear distance between the vibration device and the battery in a plan view is greater than the first linear distance between the vibration device and the first long side edge and the third linear distance between the battery and the second long side edge.

4. The display device of claim 3, further comprising a panel lower sheet disposed on the display panel, the panel lower sheet having a first surface facing the display panel and a second surface opposite to the first surface, wherein the vibration device and the battery are each attached to the second surface of the panel lower sheet.

5. The display device of claim 1, wherein the second linear distance between the vibration device and the second long side edge ranges from about 1.2 times to about 9 times the first linear distance between the vibration device and the first long side edge.

6. The display device of claim 5, wherein the battery includes first and second side edges substantially parallel to the first and the second short side edges of the frame, the first side edge being closer to the vibration device than the second side edge, and a fifth linear distance between the vibration device and the first short side edge ranges from about 0.8 times to about 1.2 times a sixth linear distance from the vibration device to an extension line of the first side edge of the battery.

7. The display device of claim 6, wherein the vibration device includes third and fourth side edges substantially parallel to the first and the second short side edges of the frame, the third side edge being closer to the battery than the fourth side edge, and a first area of a region formed by the first side edge of the battery and the third side edge of the vibration device has a size in a range between a second area defined by the vibration device and a third area defined by the battery.

8. The display device of claim 5, wherein the battery has a generally quadrangular shape, and a fifth linear distance from a center of the vibration device to a center of the battery is greater than or equal to about 1.5 times a sixth linear distance from the center of the battery and an edge thereof.

9. The display device of claim 8, wherein the battery includes first and second side edges substantially parallel to the first and the second short side edges of the frame, and the sixth linear distance is a distance from the center of the battery to the first side edge or second side edge of the battery.

10. The display device of claim 1, wherein the vibration device comprises a sound generation device selected from the group consisting of a piezoelectric element or a piezoelectric actuator.

11. A display device comprising:
a display panel;
a panel lower sheet disposed on the display panel and having a first surface facing the display panel and a second surface opposite to the first surface;
a frame disposed on the second surface of the panel lower sheet and having a first hole and a second hole spaced apart from the first hole;
a vibration device disposed on the display panel and received in the first hole; and
a battery disposed on the display panel and received in the second hole,
wherein the vibration device and the battery are each attached to the second surface of the panel lower sheet;
the frame has a first long side edge, a second long side edge opposite to the first long side edge, a first short side edge disposed between the first and second long side edges, and a second short side edge opposite to the first short edge, and
a first linear distance between the vibration device and the battery is greater than each of (i) a second linear distance between the vibration device and the first long side edge and (ii) a third linear distance between the battery and the second long side edge.

12. The display device of claim 11, wherein the frame comprises a bracket including the first and second long side edges and the first and second short side edges, and a fourth linear distance between the vibration device and the second long side edge is greater than or equal to about 1.2 times the second linear distance between the vibration device and the first long side edge.

13. The display device of claim 12, wherein the battery includes first and second side edges substantially parallel to the first and the second short side edges of the bracket, the first side edge being closer to the vibration device than the second side edge, and a fifth linear distance between the vibration device and the first short side edge ranges from about 0.8 times to about 1.2 times a sixth linear distance from the vibration device to an extension line of the first side edge of the battery.

14. The display device of claim 13, wherein the vibration device includes third and fourth side edges substantially parallel to the first and the second short side edges of the bracket, the third side edge being closer to the battery than the fourth side edge, and a first area of a region formed by the first side edge of the battery and the third side edge of the vibration device has a size in a range between a second area defined by the vibration device and a third area defined by the battery.

15. A display device comprising:
a display panel;
a frame disposed on the display panel and having a first hole and a second hole spaced apart from the first hole;
a vibration device disposed on the display panel and received in the first hole view; and
a battery disposed on the display panel and received in the second hole, wherein the frame has a first long side edge, a second long side edge opposite to the first long side edge, a first short side edge disposed between the first and second long side edges, and a second short side edge opposite to the first short side edge, the battery includes first and second side edges substantially parallel to each other, the first side edge being closer to the vibration device than the second side edge of the battery, and a first linear distance between the vibration device and the first short side edge ranges from about 0.8 times to about 1.2 times a second linear distance from the vibration device to an extension line of the first side edge of the battery.

16. The display device of claim 15, wherein the vibration device is disposed adjacent to the first short side edge, and the battery is disposed adjacent to the second short side edge.

17. The display device of claim 16, further comprising a panel lower sheet disposed on the display panel, the panel lower sheet having a first surface facing the display panel and a second surface opposite to the first surface, wherein the vibration device and the battery are each attached to the second surface of the panel lower sheet.

18. The display device of claim 16, wherein the vibration device includes third and fourth side edges substantially parallel to the first and the second side edges of the battery, the third side edge being closer to the battery, and a first area of a region formed by the first side edge of the battery and the third side edge of the vibration device has a size in a range between a second area defined by the vibration device and a third area defined by the battery.

19. The display device of claim 18, wherein the vibration device partially overlaps the battery in a longitudinally extending direction of the first long side edge.

20. The display device of claim 18, wherein the vibration device completely overlaps the battery in a longitudinally extending direction of the first long side edge.

21. A display devise comprising:
a display panel;
a frame disposed on the display panel and having a first hole and a second hole spaced apart from the first hole;
a vibration device disposed on the display panel and received in the first hole; and
a battery disposed on the display panel and received in the second hole,
wherein the frame has a first long side edge, a second long side edge opposite to the first long side edge, a first short side edge disposed between the first and second long side edges, and a second short side edge opposite to the first short side edge,
the vibration device is disposed adjacent to the first long side edge,
the battery is disposed adjacent to the second long side edge, and
a first linear distance between the vibration device and the battery in a plan view is greater than a second linear distance between the vibration device and the first long side edge and a third linear distance between the battery and the second long side edge.

* * * * *